(12) United States Patent
Katou et al.

(10) Patent No.: US 9,005,853 B2
(45) Date of Patent: Apr. 14, 2015

(54) PHOTOSENSITIVE RESIN COMPOSITION, PHOTOSENSITIVE FILM, RIB PATTERN FORMATION METHOD, HOLLOW STRUCTURE AND FORMATION METHOD FOR SAME, AND ELECTRONIC COMPONENT

(75) Inventors: Sadaaki Katou, Ibaraki (JP); Junichi Kamei, Chiba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 44 days.

(21) Appl. No.: 13/698,374

(22) PCT Filed: May 19, 2011

(86) PCT No.: PCT/JP2011/062043
§ 371 (c)(1),
(2), (4) Date: Dec. 6, 2012

(87) PCT Pub. No.: WO2011/145750
PCT Pub. Date: Nov. 24, 2011

(65) Prior Publication Data
US 2013/0076458 A1    Mar. 28, 2013

(30) Foreign Application Priority Data

May 20, 2010 (JP) ................................. 2010-116234
Aug. 24, 2010 (JP) ................................. 2010-187658
Aug. 24, 2010 (JP) ................................. 2010-187662

(51) Int. Cl.
G03F 7/004    (2006.01)
B32B 1/06    (2006.01)
(Continued)

(52) U.S. Cl.
CPC . *G03F 7/031* (2013.01); *B32B 1/06* (2013.01); *C08F 2/48* (2013.01); *C08F 222/1006* (2013.01);
(Continued)

(58) Field of Classification Search
None
See application file for complete search history.

(56) References Cited

U.S. PATENT DOCUMENTS 4,187,366 A * 2/1980 Friedlander et al. ............ 528/75
2004/0013976 A1 * 1/2004 Fujimoto et al. ......... 430/270.14
(Continued)

FOREIGN PATENT DOCUMENTS

EP    2 008 636 A1 * 12/2008
JP    5-301959        11/1993
(Continued)

OTHER PUBLICATIONS

Computer-generaed translation of JP 2010-145522 (Jul. 2010).*
(Continued)

*Primary Examiner* — John A. McPherson
(74) *Attorney, Agent, or Firm* — Antonelli, Terry, Stout & Kraus, LLP

(57) ABSTRACT

Provided are a photosensitive resin composition which is excellent in a moisture and heat resistance and provides a cured product thereof with a high elastic modulus at high temperature and which is excellent as well in a hollow structure holding property and a photosensitive film prepared by using the same, a forming method for a rib pattern, a hollow structure and a forming method for the same and an electronic component. In an electronic component having a hollow structure, a photosensitive resin composition is used as a rib material or a cover material for forming the hollow structure described above, and it is characterized by using a photosensitive resin composition containing (A) a photopolymerizable compound having at least one ethylenically unsaturated group and (B) a photopolymerization initiator and a photosensitive film obtained from the above photosensitive resin composition. Used as the component (A) are acrylate compounds or methacrylate compounds, to be specific, an acrylate compound or a methacrylate compound having an amide group and an acrylate compound or a methacrylate compound containing a urethane bond.

21 Claims, 6 Drawing Sheets

(51) Int. Cl.
*C08F 2/48* (2006.01)
*G03F 7/027* (2006.01)
*G03F 7/028* (2006.01)
*G03F 7/031* (2006.01)
*G03F 7/20* (2006.01)
*H03H 9/10* (2006.01)
*H03H 9/64* (2006.01)
*C08F 222/10* (2006.01)

(52) U.S. Cl.
CPC ............... *G03F 7/027* (2013.01); *G03F 7/028* (2013.01); *G03F 7/20* (2013.01); *H03H 9/1071* (2013.01); *H03H 9/64* (2013.01); *Y10T 428/1352* (2013.01)

(56) References Cited

U.S. PATENT DOCUMENTS

| | | | |
|---|---|---|---|
| 2004/0157154 A1* | 8/2004 | Kuroki et al. | 430/270.1 |
| 2009/0246494 A1* | 10/2009 | Matsumoto | 428/220 |
| 2009/0321693 A1 | 12/2009 | Ohkuma et al. | |
| 2011/0008611 A1 | 1/2011 | Shiraishi et al. | |
| 2013/0076458 A1 | 3/2013 | Katou et al. | |

FOREIGN PATENT DOCUMENTS

| | | |
|---|---|---|
| JP | 6-164292 | 6/1994 |
| JP | 8-191181 | 7/1996 |
| JP | 8-204482 | 8/1996 |
| JP | 2001-244785 | 9/2001 |
| JP | 2003-207889 | 7/2003 |
| JP | 2004-64732 | 2/2004 |
| JP | 2005-134893 | 5/2005 |
| JP | 2008-963 | 1/2008 |
| JP | 2008-964 | 1/2008 |
| JP | 2008-227748 | 9/2008 |
| JP | 2008-250200 | 10/2008 |
| JP | 2009-226571 | 10/2009 |
| JP | 2010-20107 | 1/2010 |
| JP | 2010-20108 | 1/2010 |
| JP | 2010-145522 | 7/2010 |
| JP | 2010-250020 | 11/2010 |
| JP | 2011-13602 | 1/2011 |
| WO | WO 2008/041630 A1 | 4/2008 |

OTHER PUBLICATIONS

Taiwanese Official Action dated Dec. 17, 2013, for TW Application No. 100117803.

Chinese Official Action dated Sep. 3, 2014, for CN Application No. 201180025022.8.

Japanese Official Action dated Oct. 7, 2014, for JP Application No. 2011-167045.

Japanese Official Action dated Oct. 7, 2014, for JP Application No. 2012-515956.

* cited by examiner (a)

(b)

(c)

PHOTOSENSITIVE RESIN COMPOSITION, PHOTOSENSITIVE FILM, RIB PATTERN FORMATION METHOD, HOLLOW STRUCTURE AND FORMATION METHOD FOR SAME, AND ELECTRONIC COMPONENT

TECHNICAL FIELD

The present invention relates to a photosensitive resin composition capable of forming a thick film which is excellent in a moisture and heat resistance and has a high elastic modulus at high temperature, and a photosensitive film prepared by using the same, a method for forming a rib pattern, a hollow structure and a method for forming the same and electronic components.

BACKGROUND ART

In recent years, a high integration of semiconductor devices and a reduction in a size thereof are promoted, whereby a rapid increase in a capacity thereof and a reduction in a cost thereof are materialized. A package of devices which is represented by a surface acoustic wave (SAW) filter and in which electrode patterns and fine structures are formed on a surface of a single-crystal wafer to exert specific electrical functions is changed in characteristics by covering a surface of functional part thereof with a resin and the like, and therefore it requires a hollow structure so that other objects are not brought into contact with particularly functionally important parts on a surface of the devices. Also, image sensors represented by CMOS and CCD sensors are provided with a hollow structure in which a light receiving section is covered with a glass cover so that the devices are protected from moisture and dusts preventing taking an image and are not cut off from light coming from the outside. In addition thereto, a hollow structure is used as well for protecting movable parts in MEMS (micro electro mechanical system) of high frequency application such as gyro sensors, millimeter radars and the like.

In the above devices requiring a hollow structure, hollow structures have so far been formed by processing and connecting inorganic materials (refer to the following patent document 1). However, the problems that the costs are elevated due to an increase in the number of the components and the number of the processes and that it is difficult to reduce a size thereof and decrease a height thereof due to limitation in terms of a structure thereof have been involved in processing the above inorganic materials (refer to the following patent documents 2 and 3).

A method for forming a hollow structure by a resin film of a non-photosensitive type as an alternate material for the inorganic materials (ceramics) is proposed in order to solve the above problems (refer to the following patent document 4). However, the problems that a reliability in the moisture and heat resistance and the hollow part holding property is uncertain and that drilling an electrode part by a laser beam is necessary for a reduction in a size have been involved as well in the above method, and it is not satisfactory in terms of the quality and the cost.

Accordingly, methods for forming a hollow structure by using photosensitive resins are reported because of the reasons that drilling processing can readily be carried out by photolithography and that the moisture and heat resistance and the hollow part holding property are provided (refer to the following patent documents 5, 6, 7, 8 and 9).

Patent document 1: Japanese Patent Application Laid-Open No. 1996/191181
Patent document 2: Japanese Patent Application Laid-Open No. 2001/244785
Patent document 3: Japanese Patent Application Laid-Open No. 1996/204482
Patent document 4: Japanese Patent Application Laid-Open No. 1994/164292
Patent document 5: Japanese Patent Application Laid-Open No. 2008/227748
Patent document 6: Japanese Patent Application Laid-Open No. 2004/64732
Patent document 7: Japanese Patent Application Laid-Open No. 2008/963
Patent document 8: Japanese Patent Application Laid-Open No. 2008/964
Patent document 9: Japanese Patent Application Laid-Open No. 2008/250200

DISCLOSURE OF INVENTION

However, in the elastic wave device described in the patent document 5, a photosensitive resin (epoxy resin) is formed in a thickness of about 10 μm as a part of a rib material of a hollow structure, and a method for forming a rib material having a large thickness by one exposure using a photosensitive material is not disclosed therein. Also, in the surface acoustic wave equipment described in the patent document 6 described above, a photosensitive resin is applied as a weir for preventing a sealing resin from flowing in, and a fine pattern formability and a reliability of the photosensitive resin described above are not at all considered.

In the patent documents 7, 8 and 9 described above, photosensitive epoxy resins are listed as photosensitive resins which makes it possible to form a thick film of about 30 μm necessary for forming a rib of a hollow structure, and though they have an excellent effect in terms of a pattern formability thereof, a reliability thereof as a device for MEMS is uncertain.

In general, it is known well that since photosensitive resins are limited in a selection range of materials thereof as compared with those of thermosetting resins cured only by heating, it is more difficult than in the thermosetting resins described above to prepare a composition thereof which is excellent in a moisture and heat resistance and an adhesive property onto a substrate. For example, the photosensitive epoxy resins described in the patent documents 5 to 9 tend to be raised in the coefficient of moisture absorption and the coefficient of moisture permeability than thermosetting epoxy resins, and the problems that the sufficiently high moisture and heat resistance is not obtained and that a desired reliability thereof as a hollow structure device can not be secured are involved therein. Also, an elastic modulus of the photosensitive epoxy resins at high temperature after photocured is not specifically described in the patent documents 5 to 9 described above, and it is considered that deformation, sagging or dent of the resin is generated during production and use thereof and that the hollow structure holding property is damaged to result in bringing about characteristically large damages. In particular, when molding is carried out by a sealing resin at a subsequent step in a hollow structure device in order to secure the reliability and form a module with other devices, a hollow has a risk to be crushed when pressure is applied on the hollow structure under the condition of high temperature and high pressure, and therefore a form and electric characteristics thereof can not be maintained to bring about a large problem. Further, in a high temperature repeating process in solder reflow carried out when mounting devices on a substrate, the problem in terms of production that not only deformation but also cracks and peeling are very likely to be generated has been brought about. In addition thereto, in the elastic wave devices described in the patent documents 5 to 9 described above, patterns are formed in a size of an opening diameter of 100 μm or more by photolithograpy, and formation of finer patterns than the above size is not disclosed. It is uncertain whether or not fine patterns can be formed by the photosensitive epoxy resins.

On the other hand, photosensitive resins having a high heat resistance and a high reliability include photosensitive polyimide resins in addition to the photosensitive epoxy resins. In general, the problem that it is difficult to form films having a thickness of 10 μm or more by photosensitive polyimide resins is involved therein. Accordingly, it is difficult to form a sufficiently large thickness necessary for forming a rib of a hollow structure. In reducing a size of a hollow structure device and providing it with a high precision, it is indispensable to form a rib having a large thickness and fine patterns, but the photosensitive polyimide resins have a small selection range of materials which can be applied and can not meet the above requirement. Also, when the photosensitive polyimide resins are applied to a cover part of a hollow structure, it is difficult to form a large thickness, and therefore the cover part can not help having a thin film form and can not stand a high temperature and a high pressure condition. It is possible as well to use them in combination with materials having a high rigidity as reinforcing materials, but another problems that the material cost and the production steps are increased are brought about. In addition thereto, the photosensitive polyimide resins have to be cured at 250° C. or higher in order to materialize desired physical properties and characteristics, and therefore it is difficult to apply them to SAW filter devices and the like which are likely to generate a stress and bring about breaking of a substrate when heated at the above temperature. As shown above, conventional photosensitive polyimide resins is narrowed in application ranges thereof for forming a rib part and a cover part of a hollow structure, and the structure and the physical properties and characteristics of the materials themselves have to be improved to a large extent.

Accordingly, the present invention has been made in order to solve the above problems, and an object thereof is to provide a photosensitive resin composition which is excellent in a fine pattern formability and provides a cured product thereof with a high elastic modulus at high temperature and which is excellent in a moisture and heat resistance and excellent as well in a hollow structure holding property and a photosensitive film prepared by using the same.

Intense investigations comprehensively made by the present inventors on a reliability improvement, a high elastic modulus, a thick film formability and a pattern formability of a photosensitive resin composition applied to a cover material or a rib material for forming a hollow structure in order to achieve the object described above have resulted in finding that the object described above can be achieved by optimizing the constitutional components of the photosensitive resin composition described above, paying attentions to a photopolymerizable compound having at least one ethylenically unsaturated group as a photopolymerizable compound instead of conventional epoxy resins and polyimide resins and specifying a structure thereof. Thus, they have come to complete the present invention.

That is, the present invention relates to the following items (1) to (18).

(1) A photosensitive resin composition containing (A) a photopolymerizable compound having at least one ethylenically unsaturated group and (B) a photopolymerization initiator.

(2) The photosensitive resin composition according to the item (1) described above, wherein the photopolymerizable compound (A) having at least one ethylenically polymerizable group is an acrylate compound or a methacrylate compound.

(3) The photosensitive resin composition according to the item (1) or (2) described above, wherein the acrylate compound or the methacrylate compound contains a carbon-nitrogen bond.

(4) The photosensitive resin composition according to any of the items (1) to (3) described above, wherein the acrylate compound or the methacrylate compound contains an amide bond.

(5) The photosensitive resin composition according to any of the items (1) to (4) described above, wherein the photopolymerizable compound (A) having at least one ethylenically unsaturated group is represented by the following Formula (1):

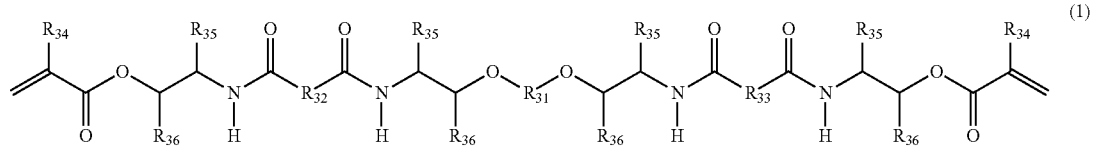

(in Formula (1), $R_{31}$, $R_{32}$ and $R_{33}$ each represent independently a divalent organic group; $R_{34}$ represents a hydrogen atom or a methyl group; and $R_{35}$ and $R_{36}$ each represent independently a hydrogen atom, an alkyl group having 1 to 4 carbon atoms or a phenyl group).

(6) The photosensitive resin composition according to any of the items (1) to (3) described above, wherein the photopolymerizable compound (A) having at least one ethylenically unsaturated group is an acrylate compound or a methacrylate compound containing a urethane bond.

(7) The photosensitive resin composition according to the item (4) described above, wherein the acrylate compound or the methacrylate compound comprises the acrylate compound or the methacrylate compound containing an amide bond, and an acrylate compound or a methacrylate compound containing a urethane bond.

(8) The photosensitive resin composition according to the item (5) described above, wherein the acrylate compound or the methacrylate compound comprises the compound represented by Formula (1) described above, and an acrylate compound or a methacrylate compound containing a urethane bond.

(9) The photosensitive resin composition according to any of the items (1) to (8) described above, further containing (C) an inorganic filler.

(10) The photosensitive resin composition according to any of the items (1) to (9) described above, wherein a tensile elastic modulus after cured is 0.5 GPa or more at 150° C.

(11) A photosensitive film prepared by molding the photosensitive resin composition according to any of the items (1) to (10) described above in a film form.

(12) A hollow structure formed on a substrate of an electronic component by a rib material and a cap material, wherein the rib material and/or the cap material comprise the photosensitive resin composition according to any of the items (1), (2), (3), (4), (5), (6) and (7) described above or a photosensitive film prepared by molding the photosensitive resin composition according to any of the items (1), (2), (3), (4), (5), (6) and (7) described above in a film form.

(13) A hollow structure formed on a substrate of an electronic component by a rib material and a cap material, wherein the rib material and/or the cap material comprise the photosensitive resin composition according to the item (5) or (8) described above or a photosensitive film prepared by molding the photosensitive resin composition according to the item (5) or (8) described above in a film form.

(14) A forming method of a rib pattern for forming a hollow structure comprising a photosensitive resin layer laminating step for laminating the photosensitive resin composition according to any of the items (1) to (10) described above or the photosensitive film according to the item (11) described above on a substrate, an exposing step for irradiating a prescribed part of the photosensitive resin layer with an active energy light ray via a mask to photocure the exposed part, a removing step for removing parts other than the exposed part of the photosensitive resin layer with a developer and a thermal curing step for thermally curing the exposed part of the photosensitive resin layer to form a resin cured product.

(15) A forming method for a hollow structure comprising a photosensitive resin layer laminating step for laminating the photosensitive resin composition according to any of the items (1) to (10) described above or the photosensitive film according to the item (11) described above on a rib pattern provided for forming a hollow structure on a substrate so that a cover part of the hollow structure is formed thereon, an exposing step for irradiating a prescribed part of the photosensitive resin layer with an active energy light ray via a mask to photocure the exposed part, a removing step for removing parts other than the exposed part of the photosensitive resin layer with a developer and a thermal curing step for thermally curing the exposed part of the photosensitive resin layer to form a resin cured product.

(16) The forming method for a hollow structure according to the item (15) described above, wherein the rib pattern provided for forming a hollow structure on the substrate is formed by the method according to the item (14) described above.

(17) An electronic component having a hollow structure prepared by forming a rib part or a cap part of the hollow structure by using the photosensitive resin composition according to any of the items (1) to (10) described above or the photosensitive film according to the item (11) described above.

(18) The electronic component according to the item (17) described above, wherein it is a surface acoustic wave filter.

Effect of the Invention

In the photosensitive resin composition of the present invention, the constitution of the photopolymerizable compound (A) having at least one ethylenically unsaturated group and the photopolymerization initiator (B) makes it possible not only to form fine patterns in a thick film but also enhance the characteristics of the resin cured product such as a high elastic modulus at high temperature and a high adhesive property with a substrate. Accordingly, when the photosensitive resin composition of the present invention is applied to electronic devices having a hollow structure, they are excellent in a hollow structure holding property since it has a high elastic modulus at high temperature, a rigidity and a moisture and heat resistance. Also, in the photosensitive resin composition of the present invention, an acrylate compound or a methacrylate compound is used as the photopolymerizable compound (A) having at least one ethylenically unsaturated group, whereby a resin cured product which is excellent in a photocuring property even in a thick film and excellent in a rigidity is obtained. In particular, an acrylate compound or a methacrylate compound containing an amide bond and an acrylate compound or a methacrylate compound having a urethane bond not only allow the high elastic modulus at high temperature to be exerted but also make it possible to hold the high adhesive property with the substrate, and therefore they provide a large effect of enhancing the reflow cracking resistance even in a thick film. As shown above, the photosensitive resin composition of the present invention provides the more excellent moisture and heat resistance by combination of the specific photopolymerizable compound with the photopolymerization initiator and holds a high adhesive property even in a severe high temperature and high humidity environment as is the case with, for example, in a PCT (pressure cooker) test, and a reliability of the hollow structure device can be secured.

In addition thereto, capable of being provided according to the present invention are a photosensitive resin composition which not only is excellent in a moisture and heat resistance and has a high elastic modulus at high temperature and a durability against temperature and pressure in molding a sealant but also can meet solvent development, provides a good resolution even in a film form and can form images, a photosensitive film prepared by using the same, a rib pattern and a hollow structure and a forming method for the same and electronic components.

Further, adding an inorganic filler to the photosensitive resin composition of the present invention not only allows the high elastic modulus to be exerted at high temperature but also makes it easy to provide a resin cured product having an excellent rigidity and makes it possible to achieve the high hollow structure holding property even under a severer high temperature and high pressure condition. Also, adding the inorganic filler to the photosensitive resin composition of the present invention makes it possible to provide the resin cured product with low thermal expansion and reduce the coefficient of moisture absorption, and therefore a rib part and a cover part each having a high reliability can be formed in the hollow structure device.

BRIEF EXPLANATIONS OF DRAWINGS

BEST MODE FOR CARRYING OUT THE INVENTION

Figure 1:
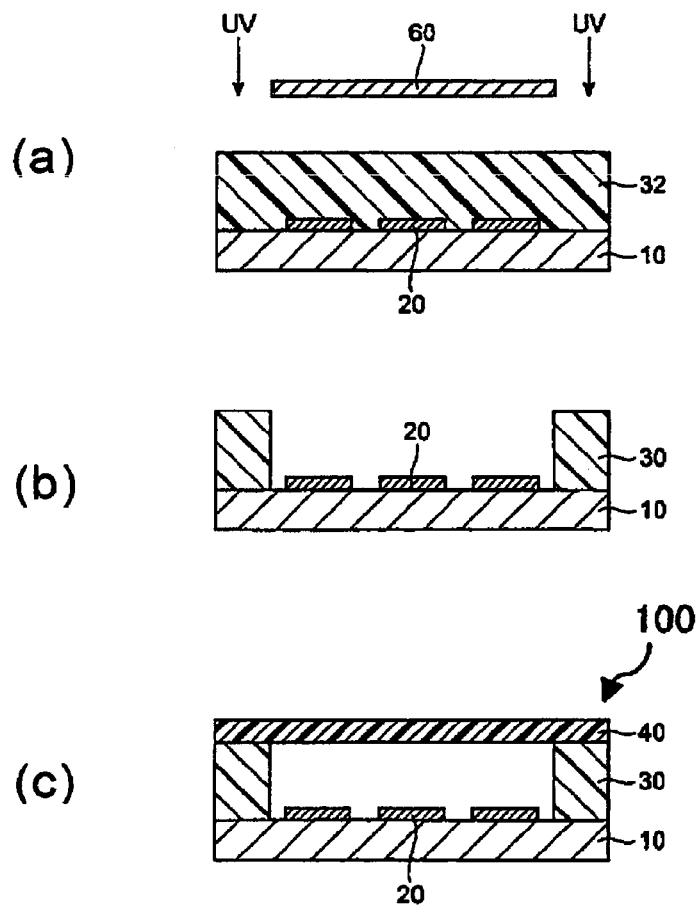
FIG. 1 is a drawing showing one suitable embodiment of a SAW filter which is one of the electronic components of the present invention and a production method for the same.

The suitable embodiment of the present invention shall be explained below in detail while referring to the drawings in a certain case. In the following explanations, the same codes shall be given to the same or corresponding parts to omit duplicated explanations. Also, dimensional ratios in the drawings shall not be restricted to the ratios shown therein.

In the present invention, required is the photosensitive resin composition which is excellent in a light transmittance and a fine patterning property even in a thick film in order to form patterns by exposing a rib part and a cover part of a hollow structure to light and which provides a resin cured product thereof with a high heat resistance and has a low moisture absorption property and a low moisture permeability in order to enhance the moisture and heat resistance. The photopolymerizable compound having at least one ethylenically unsaturated group not only has a high photopolymerization reactivity and is excellent in photosensitive characteristics such as a thick film formability and a pattern formability but also makes it easy to introduce into a molecule, a chemical structure for enhancing a heat resistance of the resin cured product, to be specific, heightening a glass transition temperature thereof and reducing a coefficient of moisture absorption thereof, and therefore it is a particularly suitable resin in the present invention. Also, the photopolymerizable compound having at least one ethylenically unsaturated group has a wide selection range as a material having a low viscosity, and therefore it is easy to arbitrarily control a viscosity of the photosensitive resin composition coated on a substrate when forming a rib part or a cover part. A viscosity of the photosensitive resin composition coated can be reduced as well by using a solvent, and when using the photopolymerizable compound having at least one ethylenically unsaturated group, an amount of a solvent which exerts an adverse effect on a characteristic and a reliability of the resin composition after cured can be reduced. In addition thereto, when the inorganic filler is added to the photosensitive resin composition, a coating property and a film formability of the photosensitive resin composition can be maintained, for example, even if a blending amount of the inorganic filler is increased.

Further, the effects of the present invention can be enhanced by using a compound having a specific structure as the photopolymerizable compound (A) having at least one ethylenically unsaturated group. The photosensitive resin composition of the present invention shall be explained below.

Photosensitive Resin Composition:

The fundamental constitution of the photosensitive resin composition of the present invention comprises the photopolymerizable compound (A) having at least one ethylenically unsaturated group and the photopolymerization initiator (B).

The photopolymerizable compound having at least one ethylenically unsaturated group is preferably a compound containing a carbon-nitrogen bond. It includes, for example, a polymerizable compound having an amide bond and a polymerizable compound having a urethane bond. The high moisture and heat resistance, and the high adhesive property can be provided by using the above compounds containing a carbon-nitrogen bond.

The photopolymerizable compound having at least one ethylenically unsaturated group includes, for example, compounds obtained by reacting polyhydric alcohols with α,β-unsaturated carboxylic acids, polymerizable compounds having an amide bond and at least one ethylenically unsaturated group, bisphenol A base (meth)acrylate compounds, compounds obtained by reacting glycidyl group-containing compounds with α,β-unsaturated carboxylic acids, urethane monomers or urethane oligomers such as (meth)acrylate compounds having a urethane bond and compounds which are copolymers of alkyl (meth)acrylates and into which ethylenically unsaturated groups are introduced. They are used alone or in combination of two or more kinds thereof.

The foregoing compounds obtained by reacting polyhydric alcohols with α,β-unsaturated carboxylic acids include, for example, polyethylene glycol di(meth)acrylates having 2 to 14 ethylene groups, polypropylene glycol di(meth)acrylates having 2 to 14 propylene groups, polyethylene.polypropylene glycol di(meth)acrylates having 2 to 14 ethylene groups and 2 to 14 propylene groups, trimethylolpropane di(meth)acrylate, trimethylolpropane tri(meth)acrylate, ethylene oxide (EO)-modified trimethylolpropane tri(meth)acrylate, propylene oxide (PO)-modified trimethylolpropane tri(meth)acrylate, EO-, PO-modified trimethylolpropane tri(meth)acrylate, tetramethylolmethane tri(meth)acrylate, tetramethylolmethane tetra(meth)acrylate, dipentaerythritol penta(meth)acrylate, dipentaerythritol hexa(meth)acrylate and the like. They are used alone or in combination of two or more kinds thereof.

The foregoing polymerizable compounds having an amide bond and at least one ethylenically unsaturated group are preferably compounds having two or more ethylenically unsaturated groups in a molecule since a cured film thereof can readily be raised in a heat resistance and enhanced in an elastic modulus at high temperature, and a compound represented by the following Formula (1) which can enhance the adhesive property with a substrate is particularly preferred:

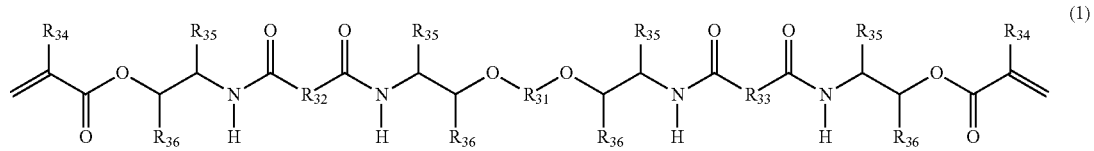

(in Formula (1), $R_{31}$, $R_{32}$ and $R_{33}$ each represent independently a divalent organic group; $R_{34}$ represents a hydrogen atom or a methyl group; and $R_{35}$ and $R_{36}$ each represent independently a hydrogen atom, an alkyl group having 1 to 4 carbon atoms or a phenyl group).

The polymerizable compound represented by Formula (1) described above is preferably di(meth)acrylate having an amide bond which is obtained by reacting an oxazoline-containing compound with a carboxyl group-containing compound and/or a phenolic hydroxyl group-containing compound. The above polymerizable compound represented by Formula (1) described above can be obtained by reacting, for example, bisoxazoline represented by the following Formula (2) with a compound having two phenolic hydroxyl groups in a molecule and (meth)acrylic acid:

[Ka 2]

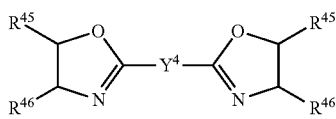
(2)

In Formula (2), $Y^4$ represents a divalent organic group and is preferably a phenylene group which may have a substituent, a pyridylene group which may have a substituent or an alkylene group having 1 to 10 carbon atoms which may be branched. Also, $R^{45}$ and $R^{46}$ each represent independently a hydrogen atom, an alkyl group having 1 to 4 carbon atoms or a phenyl group.

The bisoxazoline represented by Formula (2) described above includes, for example, 2,2'-(1,3-phenylene)bis-2-oxazoline, 2,2'-(1,4-phenylene)-bis-(2-oxazoline), 2,6-bis(4-isopropyl-2-oxazoline-2-yl)pyridine, 2,2'-isopropylidenebis(4-phenyl-2-oxazoline, 2,2'-isopropylidenebis(4-tertiary butyl-2-oxazoline), 2,2'-ethylene-bis(2-oxazoline), 2,2'-tetramethylene-bis(2-oxazoline), 2,2'-hexamethylene-bis(2-oxazoline) and the like. They can be used alone or in combination of two or more kinds thereof.

The foregoing compound having two phenolic hydroxyl groups in a molecule includes biphenol, tetramethylbiphenol, dihydroxynaphthalene, dihydroxymethylnaphthalene, dihydroxydimethylnaphthalene, bis(4-hydroxyphenyl) ketone, bis(4-hydroxy-3,5-dimethylphenyl) ketone, bis(4-hydroxy-3,5-dichlorophenyl) ketone, bis(4-hydroxyphenyl) sulfone, bis(4-hydroxy-3,5-dimethylphenyl) sulfone, bis(4-hydroxy-3,5-dichlorophenyl) sulfone, bis(4-hydroxyphenyl)hexafluoropropane, bis(4-hydroxy-3,5-dimethylphenyl)hexafluoropropane, bis(4-hydroxy-3,5-dichlorophenyl) hexafluoropropane, bis(4-hydroxyphenyl)dimethylsilane, bis(4-hydroxy-3,5-dimethylphenyl)dimethylsilane, bis(4-hydroxy-3,5-dichlorophenyl)dimethylsilane, bis(4-hydroxyphenyl)methane, bis(4-hydroxy-3,5-dichlorophenyl)methane, bis(4-hydroxy-3,5-dibromophenyl)methane, 2,2-bis(4-hydroxyphenyl)propane, 2,2-bis(4-hydroxy-3,5-dimethylphenyl)propane, 2,2-bis(4-hydroxy-3,5-dichlorophenyl)propane, 2,2-bis(4-hydroxy-3-methylphenyl)propane, 2,2-bis(4-hydroxy-3-chlorophenyl) propane, bis(4-hydroxyphenyl)ether, bis(4-hydroxy-3,5-dimethylphenyl)ether, bis(4-hydroxy-3,5-dichlorophenyl) ether, 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl) fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene and the like. Among them, 2,2-bis (4-hydroxy-3,5-dichlorophenyl)propane is particularly preferred. They can be used alone or in combination of two or more kinds thereof.

The foregoing polymerizable compounds having an amide bond and two or more ethylenically unsaturated groups in a molecule can be used alone or in combination of two or more kinds thereof.

The phenolic hydroxyl group-containing compound and/or the carboxyl group-containing compound are reacted with the oxazoline-containing compound preferably at a reaction temperature of 50 to 200° C. If the reaction temperature is lower than 50° C., the reaction is delayed, and if the reaction temperature is 200° C. or higher, a lot of side reactions tend to be brought about. The reaction may be carried out in a polar organic solvent such as dimethylformamide, dimethylacetamide, dimethylsulfoxide and the like in a certain case.

The foregoing compounds obtained by reacting glycidyl group-containing compounds with α,β-unsaturated carboxylic acids include, for example, epoxy acrylate compounds obtained by reacting epoxy resins such as novolac type epoxy resins, bisphenol type epoxy resins, salicylaldehyde type epoxy resins and the like with (meth)acrylic acid. Also, capable of being used as well are acid-modified epoxy acrylate compounds obtained by reacting an OH group of the epoxy acrylate compounds described above with acid anhydrides such as tetrahydrophthalic anhydride and the like. For example, EA-6340 represented by the following general formula (3) (trade name, manufactured by Shin-Nakamura Chemical Co., Ltd.) is commercially available as the above acid-modified epoxy acrylate compound:

[Ka 3]

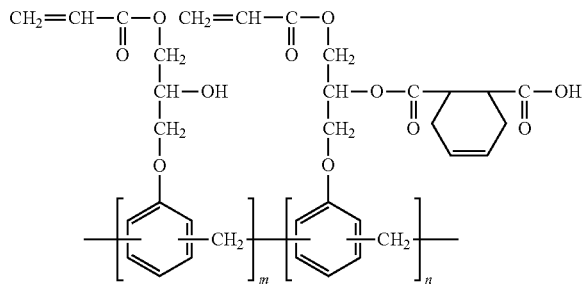
(3)

(wherein a ratio of m to n is 100/0 to 0/100).

The foregoing (meth)acrylate compounds having a urethane bond include addition products prepared by reacting (meth)acrylate monomers having an OH group in a β position, such as 2-hydroxyethyl (meth)acrylate, 4-hydroxybutyl acrylate, dipentaerythritol pentaacrylate, pentaerythritol triacrylate and the like with diisocyanate compounds such as isophoronediisocyanate, 2,6-toluenediisocyanate, 2,4-toluenediisocyanate, 2,4-tolylenediisocyanate, 2,6-tolylenediisocyanate, 1,6-hexamethylenediisocyanate, xylylenediisocyanate, diphenylmethanediisocyanate, metaphenylenediisocyanate, paraphenylenediisocyanate, dimethylbenzenediisocyanate, ethylbenzenediisocyanate, isopropylbenzenediisocyanate, 1,4-naphthalenediisocyanate, 1,5-naphthalenediisocyanate, 2,6-naphthalenediisocyanate, 2,7-naphthalenediisocyanate, cyclohexanediisocyanate, methylcyclohexanediisocyanate, 1,6-hexanediisocyanate, 1,3-bis(isocyanatemethyl)cyclohexane and the like or polyisocyanate compounds having three or more isocyanate groups, such as triphenylmethane-4,4'4"-triisocyanate and the like, addition products prepared by reacting polyisocyanate compounds with polyols such as ethylene glycol, propylene glycol, 1,4-butylene glycol, polyalkylene glycol, trimethylolpropane, hexanetriol and the like in an excess amount of the isocyanate groups based on the hydroxyl groups, buret type addition products such as hexamethylenediisocyanate, isophoronediisocyanate, tolylenediisocyanate, xylylenediisocyanate, 4,4'-diphenylmethanediisocyanate, 4,4'-methylenebis(cyclohexyl isocyanate) and the like, addition reaction products with isocyanuric ring type addition products; EO-modified urethane di(meth)acrylates; EO- or PO-modified urethane di(meth)acrylates; carboxyl group-containing urethane(meth)acrylates; diol compounds such as 1,4-butanediol, 1,5-heptanediol, 1,6-hexanediol, cyclohexanediol, cyclohexanedimethanol, polycarbonatediol, polyesterpolyol, polybutadienepolyol, polycaprolactonepolyol and the like, difunctional epoxy (meth)acrylates having two hydroxyl groups and two ethylenically unsaturated groups in a molecule, reaction products with polyisocyanates and the like.

The foregoing photopolymerizable compounds having at least one ethylenically unsaturated group are used alone or in combination of two or more kinds thereof.

A content of the foregoing photopolymerizable compound (A) having at least one ethylenically unsaturated group is preferably 80 to 99.9% by mass, more preferably 90 to 99.5% by mass and particularly preferably 95 to 99% by mass based on a whole amount of solid matters containing no inorganic filler in the photosensitive resin composition (that is, an amount of the components excluding the inorganic filler and the solvent). If a content of the foregoing photopolymerizable compound (A) having at least one ethylenically unsaturated group is 80 to 99.9% by mass, the rib pattern and the cover formed have a good shape and are provided with a sufficiently high resin strength, and a hollow structure is less liable to be crushed.

The photopolymerization initiator which is the component (B) contained together with the foregoing photopolymerizable compound (A) having at least one ethylenically unsaturated group shall not specifically be restricted as long as it produces free radicals by irradiation with an active energy light ray, and it includes, for example, aromatic ketones, acylphosphine oxides, oxime esters, quinones, benzoin ether compounds, benzyl derivatives, 2,4,5-triarylimidazole dimers, acridine derivatives, N-phenylglycine, N-phenylglycine derivatives, coumarin base compounds and the like.

The aromatic ketones include, for example, benzophenone, N,N'-tetramethyl-4,4'-diaminobenzophenone (that is, Michler ketone), N,N'-tetraethyl-4,4'-diaminobenzophenone, 4-methoxy-4'-dimethylaminobenzophenone, 2-benzyl-2-dimethylamino-1-(4-morpholinophenyl)-butane-1-one, 2-methyl-1-[4-(methylthio)phenyl]-2-morpholinopropane-1-one and the like. Page14(3rd line from the top~)

The acylphosphine oxides include, for example, bis(2,4,6-trimethylbenzoyl)-phenylphosphine oxide, 2,4,6-trimethylbenzoyl-diphenyl-phosphine oxide and the like.

The oxime esters include, for example, 1,2-octanedione-1-[4-(phenylthio)-2-(O-benzoyloxime)] and the like.

The quinones include, for example, 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, 2,3-dimethylanthraquinone and the like.

The benzoin ether compounds include, for example, benzoin methyl ether, benzoin ethyl ether, benzoin phenyl ether and the like.

The benzyl derivatives include, for example, benzoin compounds such as benzoin, methylbenzoin, ethylbenzoin and the like and benzyl dimethyl ketal.

The 2,4,5-triarylimidazole dimers include, for example, 2-(o-chlorophenyl)-4,5-diphenylimidazole dimers such as 2-(2-chlorophenyl)-1-[2-(2-chlorophenyl)-4,5-diphenyl-1,3-diazole-2-yl]-4,5-diphenylimidazole and the like, 2-(o-chlorophenyl)-4,5-di(methoxyphenyl)imidazole dimers, 2-(o-fluorophenyl)-4,5-diphenylimidazole dimers, 2-(o-methoxyphenyl)-4,5-diphenylimidazole dimers, 2-(p-methoxyphenyl)-4,5-diphenylimidazole dimers and the like.

The acridine derivatives include, for example, 9-phenylacridine, 1,7-bis(9,9'-acridinyl)heptane and the like.

The photopolymerization initiator (B) may be synthesized by an ordinary method, or commercially available products may be used. An available photopolymerization initiator (C) includes, for example, IRGACURE-369, IRGACURE-907, IRGACURE-651 and IRGACURE-819 (trade names, all manufactured by Ciba Specialty Chemicals K.K.), compounds having an oxime ester bond and the like.

Among the photopolymerization initiators (B) described above, the compounds having an oxime ester bond are particularly preferred from the viewpoints of enhancing the photocuring property and providing the high sensitivity. The compounds having an oxime ester bond include, to be more specific, 1,2-octanedione-1-[4-(phenylthio)phenyl]-2-(O-benzoyloxime) represented by the following Formula (4) (trade name: IRGACURE-OXE01, manufactured by Ciba Specialty Chemicals K.K.), 1-[9-ethyl-6-(2-methylbenzoyl)-9H-carbazole-3-yl]ethanone-1-(O-acetyloxime) (trade name: IRGACURE-OXE02, manufactured by Ciba Specialty Chemicals K.K.), 1-phenyl-1,2-propanedione-2-[0-(ethoxycarbonyl)oxime] (trade name: Quantacure-PDO, manufactured by Nippon Kayaku Co., Ltd.) and the like.

[Ka 4]

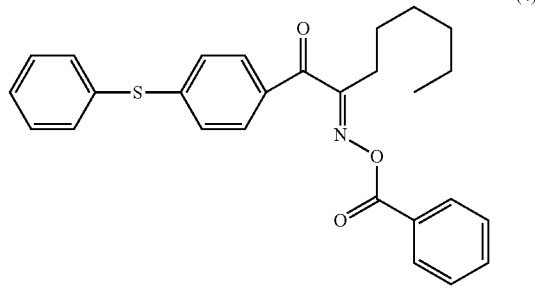

(4)

The photopolymerization initiators (B) described above can be used alone or in combination of two or more kinds thereof.

A content of the photopolymerization initiator (B) described above is preferably 0.1 to 20% by mass, more preferably 0.5 to 10% by mass and particularly preferably 1 to 5% by mass based on a whole amount of solid matters in the photosensitive resin composition. Controlling a content of the photopolymerization initiator (B) to 0.1 to 20% by mass makes it possible to enhance a sensitivity of the photosensitive resin composition and prevent the form of the resist from being deteriorated.

The photosensitive resin composition of the present invention can further contain an inorganic filler (C) in addition to the photopolymerizable compound (A) having at least one ethylenically unsaturated group and the photopolymerization initiator (B). Capable of being used as the inorganic filler are silica, alumina, titanium oxide, zirconia, ceramic fine powders, talc, mica, boron nitride, kaolin, barium sulfate and the like each having a volume average particle diameter falling in a range of 10 nm to 50 μm. If the particle diameter is less than 10 nm, the inorganic filler is liable to be coagulated in the photosensitive resin composition, and therefore it is difficult to evenly disperse the inorganic filler, so that the fine pattern formability is reduced to a large extent. In addition thereto, the physical properties and the characteristics of the cured product are scattered to a large extent in a certain case. In contrast with this, if the particle diameter exceeds 50 μm, radiated light is scattered to a large extent by the inorganic filler, and therefore the thick film formability and the fine pattern formability are reduced in a certain case.

Any of a spherical form, a crushed form, a needle form and a tabular form can be used for the form of the inorganic filler contained in the photosensitive resin composition of the present invention, and the desired form can be selected according to a particle diameter thereof. For example, the inorganic filler of a small particle diameter having a volume average particle diameter falling in a range of 10 nm to 1 μm and having a spherical form or a form close to a spherical form not only can enhance an elastic modulus of the photosensitive resin composition at high temperature but also improve a mechanical strength of the cured product, and it has an effect of providing the photosensitive resin composition before cured with a thixotropic property to enhance a coating property thereof. Accordingly, the inorganic filler of a small particle diameter is used when the physical properties and the characteristics of the photosensitive resin composition of the present invention would like to be enhanced even to a small extent without exerting an adverse effect on a light transmittance and a light absorption property thereof. Also, the inorganic filler of a large particle diameter having a volume average particle diameter falling in a range of 1 μm to 50 μm can enhance an elastic modulus of the photosensitive resin composition at high temperature to a large extent, and therefore it exerts a large effect on a form holding property of the hollow structure. Further, the inorganic filler having a tabular form can reduce a coefficient of moisture absorption and a coefficient of moisture permeability of a cured product of the photosensitive resin composition to a large extent. As shown above, in the photosensitive resin composition of the present invention which is applied to a rib part and a cover part of the hollow structure, the inorganic filler of a large particle diameter having a tabular form is suitably contained.

A principal object of the present invention is to provide the highly reliable photosensitive resin composition which secures a hollow part holding property under high temperature and high pressure and has a moisture and heat resistance, and therefore the inorganic filler having an aspect ratio of 30 to 100 and a volume average particle diameter of 5 to 50 μm is particularly preferably contained therein. Use of the inorganic filler having the aspect ratio and the volume average particle diameter each shown above makes it possible to allow the resin cured product to exert a low moisture absorption property, a low moisture permeability and an excellent rigidity and makes it possible, for example, to obtain such the hollow part holding property that can stand a sealing resin molding pressure at high temperature. Also, when the inorganic filler is added to the photosensitive resin composition, the thick film formability and the fine pattern formability which are the essential photosensitive characteristics of the present invention tend to be reduced, but they can be inhibited from being reduced by prescribing a form and a particle diameter of the inorganic filler to the aspect ratio and the volume average particle diameter each described above.

In the present invention, the aspect ratio is defined as a ratio (major diameter/thickness) of a thickness of the inorganic filler to a major diameter thereof, and it does not mean (major diameter/minor diameter) in a face of the inorganic filler. The form of the inorganic filler is preferably a form called usually tabular (including plain, discoidal, flat and scaly), and a scaly form is more preferred in the present invention. An aspect ratio of the inorganic filler is calculated by means of a scanning type electron microscope or a transmission type electron microscope, and since a volume average particle diameter of the inorganic filler is 5 μm or more in the present invention, an aspect ratio thereof can be determined by means of the scanning type electron microscope. That is, the aspect ratio is measured by observation by means of the scanning type electron microscope (SEM). First, the inorganic filler is fixed on a sample table of SEM to raise an observing magnification thereof up to a maximum at which one particle is brought into perspective and observe a form thereof, and an image thereof is introduced (photographed) from a direction of a face having the largest observed area in the above particle (that is, a relatively flat and broadened face, a cleaved face in a case of, for example, mica and the like; referred to as an X face). Next, the sample table is rotated, and an image is introduced (photographed) from a direction of a face having the smallest observed area, unlike the above case, (that is, if the particle is tabular, a face in which a thickness of the tabular particle is observed, a laminated cross section (fracture face) in a case of, for example, mica and the like; referred to as a Y face). In the images (photographs) thus obtained, first the particle image of the X face describe above is used to set a minimum circle which is inscribed in the particle and measure a diameter thereof, and the diameter is defined as a "major diameter" of the particle describe above. The particle image of the Y face describe above is used to draw two parallel lines most closely to the particle so that the particle is interposed between the lines, and an interval of the lines is defined as a "thickness". The major diameter describe above is divided by the thickness to determine the aspect ratios of the respective particles. The above operation is carried out for 100 particles of the inorganic filler which are arbitrarily selected to calculate an average value thereof, whereby an average aspect ratio thereof is determined. In the present invention, if the average aspect ratio is less than 30, light scattering in the photosensitive resin composition is reduced, and therefore a photosensitive characteristic thereof is improved. However, an effect of reducing moisture absorption and moisture permeation in the photosensitive resin is not obtained so much, and in addition thereto, an effect of providing the high elastic modulus is reduced in a certain case. For example, such the hollow part holding property that can stand the sealing resin molding pressure at high temperature can not be obtained in a certain case. In contrast with this, if the average aspect ratio exceeds 100, the photosensitive characteristics such as the thick film formability, the fine pattern formability and the like are extremely worsened.

In the present invention, an average particle diameter of the inorganic filler can be determined in the form of an MV value (mean volume diameter: volume average value) by means of a laser diffraction particle size distribution meter (for example, trade name: Micro Track MT3000, manufactured by Nikkiso Co., Ltd.). The inorganic filler can be measured and analyzed by dispersing it in water using phosphinic acid salts as a dispersant. In the present invention, when a volume average particle diameter of the inorganic filler described above is less than 5 μm, the photosensitive characteristics are improved as is the case with an instance in which the aspect ratio is small as described above. However, an effect of reducing moisture absorption and moisture permeation in the photosensitive resin is not obtained so much, and in addition thereto, an effect of providing the high elastic modulus is likely to be reduced. In contrast with this, if the volume average particle diameter exceeds 50 μm, the photosensitive characteristics such as the thick film formability, the fine pattern formability and the like are extremely worsened.

In the present invention, both of an average aspect ratio and a volume average particle diameter of the inorganic filler satisfy preferably the ranges of 30 to 100 and 5 to 50 μm respectively. When the volume average particle diameter is less than 5 μm or exceeds 50 μm even if the average aspect ratio falls in a range of 30 to 100, the photosensitive characteristics such as the thick film formability, the fine pattern formability and the like can not be consistent with a moisture and heat resistance and a high elastic modulus of the resin cured product in a certain case. Also, when the average aspect ratio is less than 30 or exceeds 100 even if a volume average particle diameter of the inorganic filler falls in a range of 5 to 50 μm, the effects of the present invention can not be provided in a certain case as is the case with the foregoing matter.

In the present invention, emphasis is put on a form maintaining property and a reliability improvement during production and use in the hollow structure device. Accordingly, if an average aspect ratio and a volume average particle diameter of the inorganic filler fall in the ranges of 30 to 100 and 5 to 50 μm respectively, the effects of the present invention can be provided, and when the average aspect ratio is set to exceeding 50 and 100 or less, the form maintaining property and the reliability improvement each described above can be enhanced to a large extent without being followed by a substantial reduction in the photosensitive characteristics, so that it is particularly suitable. In the above case, if a volume average particle diameter of the inorganic filler falls in a range of 5 to 50 μm, no problems shall be brought about in respect of providing the effects of the present invention.

In the photosensitive resin composition of the present invention, the specific inorganic filler having an average aspect ratio of 30 to 100 and a volume average particle diameter of 5 to 50 μm includes, for example, talc, mica, boron nitride, kaolin, barium sulfate and the like, and among them, mica which is scaly is preferred. Mica can be increased in an aspect ratio and has a high evenness of a form, and therefore it has the effects of not only reducing a permeability of moisture into the photosensitive resin composition and enhancing the molding resistance by providing the high elastic modulus but also inhibiting a reduction in the photosensitive characteristics more than other inorganic fillers. Also, mica includes synthetic mica and the like, and mica having less impurities is available than other natural inorganic fillers, so that a hindrance to the photocuring property can be reduced. In addition thereto, a reduction in the moisture resistance originating in impurities contained in the inorganic filler can be reduced, and therefore it has the effect that a reliability of the hollow structure device can be enhanced to a large extent.

In the present invention, in order to obtain the inorganic filler having the average aspect ratio and the volume average particle diameter each described above, commercially available products having the above characteristics may be obtained and used as they are; plural commercially available products may be mixed personally, processed and used; or commercially available products may be processed by classifying them through a sieve and used. For example, various micas manufactured by Yamaguchi Mica Co., Ltd. can be used as the commercially available products of mica, and the specific examples thereof include A-51S (average aspect ratio: 85, volume average particle diameter: 52 μm), SYA-31RS (average aspect ratio: 90, volume average particle diameter: 40 μm), SYA-21RS (average aspect ratio: 90, volume average particle diameter: 27 μm), SJ-005 (average aspect ratio: 30, volume average particle diameter: 5 μm) and the like, and they can be used as they are or after processed.

In the present invention, a strict pattern precision is not usually required when the photosensitive resin composition of the present invention is applied as a cover material for a hollow structure device, and therefore a content of the inorganic filler can be determined by a balance between the physical properties of the resin cured product and the photosensitive characteristics such as the thick film formability, the fine pattern formability and the like. However, a strict pattern precision is usually required when the resin composition is applied as a rib material for a hollow structure device, and therefore a content of the inorganic filler is preferably 0.5 to 50% by mass, more preferably 2 to 50 by mass, further preferably 5 to 45 by mass and particularly preferably 10 to 40% by mass based on a whole amount of solid matters in the photosensitive resin composition. The inorganic filler having a content of 0.5 to 50% by mass improves thick film formation and a pattern form of the photosensitive resin composition, provides the sufficiently high resin strength and can enhance even a little the physical properties and the characteristics of the resin cured product. When the photosensitive resin composition of the present invention is applied to a cover material, a content of the inorganic filler is set preferably to 0.5 to 60% by mass, more preferably 2 to 50 by mass and particularly preferably 5 to 40% by mass.

In the photosensitive resin composition of the present invention, when added is the inorganic filler having an average aspect ratio of 30 to 100 and a volume average particle diameter of 5 to 50 μm, a content of the inorganic filler is preferably 5 to 50% by mass, more preferably 20 to 50% by mass, further preferably 20 to 45% by mass and particularly preferably 20 to 40% by mass based on a whole amount of solid matters in the photosensitive resin composition. A content of 20 to 50% by mass in the inorganic filler having an average aspect ratio and a volume average particle diameter each falling in the ranges described above makes it possible to provide the resin cured product with desired physical properties and characteristics such as not only a satisfactory resin strength and a high elastic modulus at high temperature but also a low moisture absorption property, a low moisture permeability and the like without exerting an adverse effect on a thick film formability and a pattern formability of the photosensitive resin composition. In the present invention, when the photosensitive resin composition containing the inorganic filler having an average aspect ratio of 30 to 100 and a volume average particle diameter of 5 to 50 μm is applied to a cover material, a content of the inorganic filler is set preferably to 5 to 60% by mass from the viewpoint of the film coating property, more preferably 20 to 50 by mass from the viewpoint of the strength and particularly preferably 20 to 40% by mass from the viewpoint of the resolution.

Also, (D) a sensitizer can be further added to the photosensitive resin composition of the present invention. The sensitizer (D) includes, for example, pyrazolines, anthracenes, coumarins, xanthones, oxazoles, benzoxazoles, thiazoles, benzothiazoles, triazoles, stilbenes, triazines, thiophenes, naphthalimides and the like. The above sensitizers (D) are used alone or in a mixture of two or more kinds thereof.

A content of the sensitizers (D) described above is preferably 0.1 to 1% by mass based on a whole amount of solid matters in the photosensitive resin composition. If a content of the sensitizers (D) falls in the ranges described above, a sensitivity of the photosensitive resin composition is enhanced, and a compatibility thereof with a solvent is improved.

Also, (E) a heat resistant polymer can be further added to the photosensitive resin composition described above. The heat resistant polymer (E) is preferably, for example, polyimides, polyoxazoles and precursors thereof, novolac resins such as phenol novolac resins, cresol novolac resins and the like, polyamideimides, polyamides and the like each having a high heat resistance in terms of a processability. They are used alone or in a mixture of two or more kinds thereof.

A content of the heat resistant polymer (E) described above is preferably 1 to 50% by mass based on a whole amount of solid matters in the photosensitive resin composition. If a content of the heat resistant polymer (E) falls in the ranges described above, a heat resistance and a resin strength of the photosensitive resin composition are improved, and a developability thereof is improved as well.

Also, (F) a thermally cross-linkable material can be further added to the photosensitive resin composition described above. The thermally cross-linkable material (F) is preferably, for example, epoxy resins, phenol resins in which an a position is substituted with a methylol group and an alkoxymethyl group, melamine resins in which an N position is substituted with a methylol group and/or an alkoxymethyl group, urea resins and the like in terms of the resin strength after cured. They are used alone or in a mixture of two or more kinds thereof.

A content of the thermally cross-linkable material (F) described above is preferably 1 to 20% by mass based on a whole amount of solid matters in the photosensitive resin composition. If a content of the thermally cross-linkable material (F) falls in the ranges described above, a heat resistance and a resin strength of the photosensitive resin composition is improved, and a developability thereof is improved as well.

Also, (G) a thermal acid generator can be further added to the photosensitive resin composition described above. The thermal acid generator (G) includes, for example, salts formed from strong acids such as onium salts and the like and bases, imide sulfonates and the like. The onium salts include, for example, aryl diazonium salts, diaryl iodonium salts such as diphenyl iodonium salts and the like, di(alkylaryl) iodonium salts such as di(t-butylphenyl) iodonium salts and the like, trialkyl sulfonium salts such as trimethyl sulfonium salts and the like, dialkylmonoaryl sulfonium salts such as dimethylphenyl sulfonium salts and the like, diarylmonoalkyl sulfonium salts such as diphenylmethyl sulfonium salts and the like and triaryl sulfonium salts.

A blending amount of the thermal acid generator (G) described above is preferably 0.1 to 30 parts by mass, more preferably 0.2 to 20 parts by mass and further preferably 0.5 to 10 parts by mass based on 100 parts by mass of the component (A).

Also, (H) a thermal radical generator can be further added to the photosensitive resin composition described above. The thermal radical generator (H) includes, for example, peroxides such as t-butyl cumyl peroxide (perbutyl C), n-butyl 4,4-di-(t-butyl peroxy) valerate (perhexa V), dicumyl peroxide (percumyl D) and the like.

A blending amount of the thermal radical generator (H) described above is preferably 0.1 to 30 parts by mass, more preferably 0.2 to 20 parts by mass and further preferably 0.5 to 10 parts by mass based on 100 parts by mass of the component (A).

The photosensitive resin composition of the present embodiment can be obtained by mixing the photopolymerizable compound (A) described above with the photopolymerization initiator (B), if necessary, the inorganic filler (C) and other materials, for example, the sensitizer (D), the heat resistant polymer (E), the thermally cross-linkable material (F), the thermal acid generator (G) and the thermal radical generator (H) in a solvent.

The solvent used above shall not specifically be restricted and includes, for example, polar solvents comprising as principal components, N-methyl-2-pyrrolidone, N,N-dimethylacetamide, N,N-dimethylformamide, propylene glycol monomethyl ether acetate and the like and solvents such as γ-butyrolactone and the like. They are used alone or in a mixture of two or more kinds thereof.

Also, an adhesive auxiliary agent may be added, if necessary, to the photosensitive resin composition in order to enhance an adhesive property between the photosensitive resin composition and the substrate. The adhesive auxiliary agent includes, for example, silane coupling agents such as γ-glycidoxysilane, aminosilane, γ-ureidosilane and the like.

Photosensitive Film:

The photosensitive resin composition is coated on an organic film of polyethylene terephthalate and the like used as a supporting film by various publicly known methods, and it is dried to remove the solvent, whereby a photosensitive film (dry film resist) of two layers on which a photosensitive resin layer is formed can be prepared. Also, a photosensitive film of three layers obtained by further laminating thereon a protective layer such as polyethylene terephthalate, a polyethylene film, a polypropylene film and the like may be prepared. Also, if the photosensitive resin layer has a self-supporting property, the supporting film can be peeled off to prepare a photosensitive film of a single layer.

The photosensitive film of the present invention may be used, as described later, after photopolymerized by irradiating with light and then removing the supporting film when it is used for a cover part of a hollow structure, or it can be used as it is for a cover material together with the photosensitive resin composition. In the present invention, transparent or translucent heat resistant plastics (thermoplastic engineering plastics, thermosetting resins having a three-dimensional network structure or the like), glass, ceramics or the like can be used in place of the supporting film described above. The above heat resistant plastics, glass or ceramics are used in a thin film form or a thin plate form, whereby a film or a thin plate on which the photosensitive resin composition is laminated can be prepared as is the case with the supporting film described above. Also, the above heat resistant plastics, glass or ceramics have the functions of enhancing a form keeping property and a rigidity of the cover and reinforcing them.

When the photosensitive film is prepared, a thickness thereof shall not specifically be restricted, and a thickness is preferably 10 μm to 3 mm in a case of the supporting film or the supporting thin plate, preferably 1 to 500 μm in a case of the photosensitive resin layer and preferably 10 to 200 μm in a case of the protective film. A thickness of the supporting film or the supporting thin plate described above is suitably determined from the viewpoints of a form and a thickness of the hollow structure device and production thereof, and therefore a usable range thereof is broadened.

Forming Method for Rib Pattern:

Next, a forming method for the rib pattern according to the present embodiment shall be explained. In the forming method for the rib pattern according to the present embodiment, desired patterns can be formed by passing through a lamination step in which the photosensitive resin layer (photosensitive resin film) formed by using the photosensitive resin composition or the photosensitive film each described above is laminated on a substrate, an exposing step in which a prescribed part of the above photosensitive resin layer is irradiated with an active energy light ray via a mask to photocure the exposed part, a removing step in which parts other than the exposed part described above in the photosensitive resin layer is removed by using a developer and a thermal curing step in which the exposed part in the photosensitive resin layer is thermally cured to form a resin cured product.

The respective steps shall be explained below.

In the lamination step described above, the photosensitive resin composition or the photosensitive film each described above is coated and dried or laminated on the supporting substrate, whereby the photosensitive resin film can be formed. The supporting substrate includes, for example, glass substrates, semiconductors, metal oxide insulators (for example, $TiO_2$, $SiO_2$ and the like), boron nitride, ceramic piezoeletric substrates and the like. Also, a coating method for the photosensitive resin composition includes methods such as rotation coating by using a spinner, spray coating, dipping coating, roll coating and the like, but it shall not be restricted to the above methods. In a case of the photosensitive film, it can be laminated by means of a laminator and the like.

A coating film thickness of the photosensitive resin composition is varied according to the coating means and a solid matter concentration and a viscosity of the photosensitive resin composition, and usually it is coated so that a film thickness of the coating film (photosensitive resin layer) after dried is 1 to 500 μm, preferably 1 to 300 μm from the viewpoint of residual volatile matters. In order to control a film thickness of the coating film after dried to 1 to 300 μm, the photosensitive resin composition described above is dissolved in a solvent to control a viscosity thereof to preferably 0.5 to 20 Pa·s, more preferably 1 to 10 Pa·s from the viewpoint of a coating property. Also, a solid matter concentration of the photosensitive resin composition is controlled to preferably 20 to 80% by mass, more preferably 30 to 70% by mass from the viewpoint of a coating property. When a film thickness of the coating film obtained is particularly 300 μm or less, the resolution is good. When the photosensitive film is used, the photosensitive resin layer can be formed so that a film thickness thereof is controlled in advance to the film thickness described above.

Then, it is dried in a range of 60 to 120° C. for 1 minute to 1 hour by means of a hot plate, an oven and the like, whereby the photosensitive resin film can be formed on the supporting substrate.

Next, in the exposing step, the photosensitive resin film which is a coating film formed on the supporting substrate is irradiated on a prescribed part with an active energy light ray via a negative mask having, if necessary, desired patterns to photocure the exposed part.

In this connection, the active energy light ray used for exposure includes a UV ray, a visible light, an electron beam, an X ray and the like. Among them, a UV ray and a visible light are particularly preferred.

Next, in the removing step, the parts other than the exposed part of the photosensitive resin layer (unexposed parts) are removed by using an organic solvent base or alkaline aqueous solution base developer to thereby form a pattern, and then the exposed part of the photosensitive resin layer is thermally cured to form the pattern comprising a resin cured product.

In this connection, organic solvents such as N-methylpyrrolidone, ethanol, cyclohexanone, cyclopentanone and propylene glycol methyl ether acetate can be used as the developer. Also, capable of being used are alkaline aqueous solutions of sodium hydroxide, potassium hydroxide, sodium silicate, ammonia, ethylamine, diethylamine, triethylamine, triethanolamine, tetramethylammonium hydroxide and the like. Among them, propylene glycol methyl ether acetate is preferably used from the viewpoint of a developing speed.

After developed, the photosensitive resin layer is preferably rinsed, if necessary, by water, alcohols such as methanol, ethanol, isopropyl alcohol and the like, n-butyl acetate, propylene glycol monomethyl ether acetate, diethylene glycol dimethyl ether acetate and the like.

Further, the thermal curing step in which the exposed part in the photosensitive resin layer described above is thermally cured to form the resin cured product is carried out. The thermal curing after the development is carried out preferably for 1 to 2 hours while heating up in stages selecting the temperature. The thermal curing is carried out preferably at 120 to 240° C. When elevating the heating temperature in stages, heat treatment is carried out, for example, at 120° C. and 160° C. for 10 to 50 minutes (preferably about 30 minutes) respectively, and then it is carried out preferably at 220° C. for 30 to 100 minutes (preferably about 60 minutes).

Method for Forming Hollow Structure:

The rib pattern comprising the resin cured product formed by the forming method described above has a sufficiently large film thickness, and a hollow structure can be formed by covering it with a ceramic substrate, a Si substrate, a glass substrate, a metal substrate, a polyimide film, a PET film, an acryl plate and the like as a cover.

In the present invention, the photosensitive resin composition or the photosensitive film obtained by turning it into a film can be used not only as the hollow structure rib part but also as the cover part. For example, the film obtained by turning once the photosensitive resin composition described above into a film or the photosensitive film prepared in advance from it is stuck and laminated on an upper part of the pattern described above, and then it is allowed to pass through the exposing step and, if necessary, the developing step (removing step) and the thermal curing step, whereby the hollow structure can be formed. When the photosensitive resin composition or the photosensitive film of the present invention is applied for the cover, it does not necessarily have to pass through the developing step, but in the following case, the hollow structure device of the present invention is improved in a usability by employing the developing step. For example, it is a case in which when the form of the cover would like to be controlled or plural hollow structure devices are produced at the same time in a lump, only sizes corresponding to the covers of the individual hollow structure devices are exposed via a mask and in which unexposed parts in the periphery thereof are then developed to thereby divide them into the individual covers.

The lamination step, the exposing step, the removing step and the thermal curing step can be carried out in the same manners as the methods explained in the forming method for the rib pattern described above. A film thickness of the photosensitive resin layer for forming the cover part is preferably 5 to 500 μm, more preferably 10 to 400 μm. A final film thickness of the cover part formed after passing through the curing step is preferably 10 μm to 3 mm, more preferably 20 μm to 2 mm from the viewpoints of the pattern formability and a strength of the pattern. A thickness of the cover part can be controlled to a desired thickness not only by a thickness of the photosensitive resin composition or the photosensitive film of the present invention but also allowing, as described above, the supporting film or the thin plate to remain as they are as the cover material.

Also, the cover part can be adhered with the rib pattern, for example, by thermocompression bonding using a press equipment, a roll laminator and a vacuum laminator.

In the present invention, it is possible as well to produce the rib pattern without using the photosensitive resin composition of the present invention and produce only the cap part by using the photosensitive resin composition of the present invention, but if the photosensitive resin composition of the present invention is used for both of the rib pattern and the cap part, an adhesive property between them is excellent, and therefore it is preferred. In particular, the adhesive property can be further enhanced by using the photosensitive resin compositions in which the kind of the photopolymerizable compound and a content of the inorganic filler are close as the photosensitive resin compositions used for both of the rib pattern and the cover part.

As shown above, the rib patterns of a thick film can be formed in a lump by photolithography in the hollow structure forming step according to the present invention, and a cured product of the photosensitive resin composition which is formed in a film shape (or a sealing substrate of a ceramic and the like) is put thereon as the cover part for sealing, whereby the hollow structure can be formed. Also, an inside space of the above hollow structure is prevented from moisture by the peripheral photosensitive resin composition, and the hollow part is kept as well at high temperature. Accordingly, it can be applied to electronic components requiring a hollow structure such as SAW filters, CMOS·CCD sensors, MEMS and the like and is useful for a reduction in a size of electronic parts, a decrease in a height thereof and an increase in a function thereof. The photosensitive resin composition of the present invention is particularly suitable for forming a rib part and a cover part of a hollow part in SAW filters, and it is particularly suitable for forming the cover part in terms of making it possible to achieve the reliability. SAW filter and production method therefor:

The SAW filter described above and a production method for the same shall be explained. FIG. 1 (a) to (c) are step drawings showing one suitable embodiment of the SAW filter 100 of the present invention and a production method for the same.

First, as shown in FIG. 1 (a), a photosensitive resin layer 32 formed by using the photosensitive resin composition of the present invention is laminated on a substrate 10 on which a comb-shaped electrode 20 is formed. The same method as the method described in the forming method for the rib pattern described above can be used for a laminating method therefor.

The coating film thickness is controlled usually so that a film thickness of the coating film (photosensitive resin layer) after dried is 1 to 300 μm as is the case with the forming method for the rib pattern described above.

The photosensitive resin composition is coated on the substrate 10, and then the coating film is dried to obtain a photosensitive resin layer 32. Drying is carried out preferably in a range of 60 to 120° C. for 1 minute to 1 hour by means of an oven, a hot plate and the like.

Next, as shown in FIG. 1 (a), a prescribed part of the photosensitive resin layer 32 is irradiated with an active energy light ray via a negative mask 60 having, if necessary, a desired pattern to photocure an exposed part. In this connection, the active energy light ray used for exposure includes a UV ray, a visible light, an electron beam, an X ray and the like. Among them, a UV ray and a visible light are particularly preferred.

Next, as shown in FIG. 1 (b), a part (unexposed part) other than the exposed part in the photosensitive resin layer 32 is removed by using a developer of an organic solvent base to thereby form a pattern, and then the exposed part in the photosensitive resin layer 32 is thermally cured to form a rib part 30 comprising the resin cured product. The same steps as used in the forming method for the rib pattern described above can be used for the above exposing step, removing step and thermal curing step.

Next, as shown in FIG. 1 (c), a cover part 40 is provided on the rib part 30 to form a hollow structure. In this regard, the cap part 40 can be prepared, for example, by using a film formed in advance from the photosensitive resin composition of the present invention or a photosensitive film which is molded in advance. That is, the above film is stuck on an upper part of the rib part 30, and then it is exposed, developed and thermally cured, whereby the cover part 40 can be formed.

Also, the cover part 40 can be adhered with the rib part 30 by thermocompression bonding by means of, for example, a roll laminator.

The cover part 40 may be constituted by a material other than the photosensitive resin composition of the present invention. However, the cover part 40 is preferably constituted by a material which is excellent in a moisture and heat resistance and has a low water absorption coefficient. Also, a sealing substrate of ceramic and the like can be used as well for the cover part 40. In this case, at least a rib pattern formed by the photosensitive resin composition of the present invention is used as a rib material for forming a hollow structure of a SAW filter.

On the other hand, when the photosensitive resin composition or the photosensitive film of the present invention is used for the cover part for forming the hollow structure of a SAW filter, the rib part thereof may be formed by a method other than using the photosensitive resin composition of the present invention.

Figure 2:
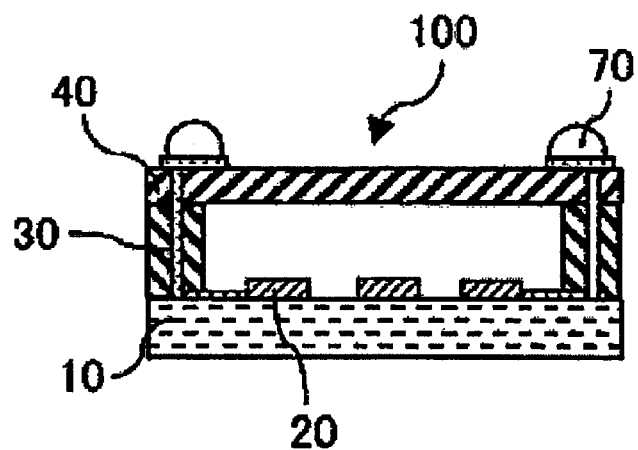
FIG. 2 is a drawing showing a SAW filter which is another embodiment of the present invention and in which metal balls are mounted.

Shown in FIG. 2 is a SAW filter obtained by forming a rib part and a cover part by using the photosensitive resin composition or the photosensitive film of the present invention, then carrying out plating in order to carry out electric connection with conductors wired in an inside of an electrode 20 and a substrate 10 and on a surface at an opposite side of the electrode 20 and mounting metal balls. The photosensitive resin composition or the photosensitive film of the present invention which is excellent in a form holding property, a heat resistance and a rigidity is applied to the SAW filter shown in FIG. 2, whereby it does not bring about such deformation as exerting an influence on the characteristics of the hollow structure device even under a high temperature reflow condition in mounting solder balls.

For example, piezoelectric substrates such as a lithium tantalate substrate, a lithium niobate substrate, a gallium arsenic substrate and the like are used as the substrate 10 described above. For example, aluminum and the like are used as a material for the comb-shaped electrode 20 described above. Metal conductors of copper, aluminum and the like and, in a case of a ceramic substrate, metal conductors of gold, silver, platinum, palladium and the like are used as materials for wirings formed in an inside of the substrate described above and on a surface thereof. Also, for example, solder materials of tin-silver-copper, lead-tin and the like, gold or resin balls covered on a surface thereof with metal conductors are used as the metal balls described above.

Figure 3:
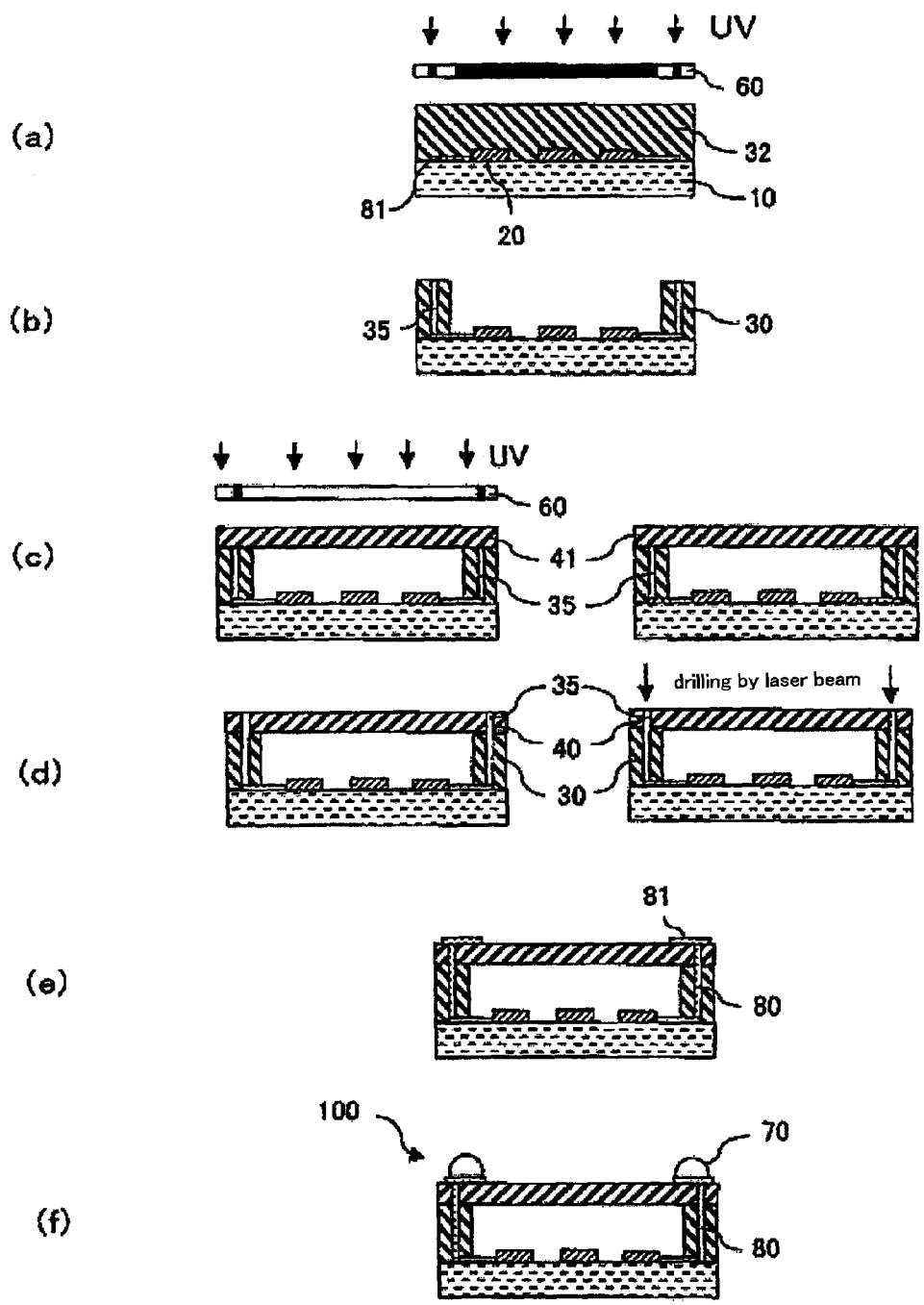
FIG. 3 is a drawing showing a production method for the SAW filter of the present invention in which metal balls are mounted.

FIG. 3 is a schematic cross-sectional drawing showing another suitable embodiment of a SAW filter which is one of the electronic components of the present invention and a production method for the same. Shown in FIG. 3 are a method for forming the rib part and the cover part of the present invention only by UV exposure and a method for forming the rib part and the cover part of the present invention by using both of UV exposure and laser beam drilling. Laser beam drilling is used in order to form a conductor in an inside of the cover part.

In FIG. 3, first, the method for forming the rib part and the cover part only by UV exposure shall be explained. A rib part 30 for forming a hollow space is formed on a conductor 81 for wiring which is electrically connected with an aluminum comb-shaped electrode 20 on a substrate 10 by the same method as shown in FIG. 1 passing through the steps of FIG. 3 (a) to (b). In this regard, a hole 35 for forming an inside conductor is formed in an inside of the rib part 30 by passing through a developing step after UV exposure. Then, the photosensitive resin composition or the photosensitive film 41 of the present invention which is laminated on a supporting film is coated or disposed on the rib part 30 described above, and it is subjected to UV exposure through a mask (FIG. 3 (c)). The mask described above is shielded so that only a part corresponding to a diameter of a hole 35 for forming an inside conductor does not transmit light, and therefore a cover part 40 in which a part other than it is photocured is formed. An unexposed part of the cover part 40 is subjected to desmear treatment and the like after carrying out development so that the unexposed part passes throughly with the hole 35 formed in advance (FIG. 3 (d)). Further, by a plating method and the like, an inside conductor is formed in the holes 35 formed in the insides of the rib part and the cover part, and wiring is formed on the surface of the cover part (FIG. 3 (e)). In the present invention, an inside conductor can be formed in the holes 35 formed in the insides of the rib part and the cover part by not only a plating method but also a conductor filling method using a metal paste or a resin paste containing metal powders. The conductor 81 which is wired with the aluminum comb-shaped electrode 20 on the substrate 10 is electrically connected with a conductor for wiring which is formed on a surface of the cover part by passing through the above steps. Finally, metal balls 70 are mounted on a surface of the cover part by reflow and the like to obtain a SAW filter which is the electronic component of the present invention having a hollow structure (FIG. 3 (f)).

Next, in FIG. 3, a method for forming the rib part and the cover part of the present invention shall be explained by using both of UV exposure and laser beam drilling. The method for forming the rib part and the cover part is fundamentally the same as in a case of only UV exposure, and it is different in terms of applying a drilling method by a laser in place of UV exposure in forming the hole 35 for forming the inside conductor in an inside of the cover part described above. That is, in FIG. 3 (c), the photosensitive resin composition or the photosensitive film 41 of the present invention which is laminated on the supporting film is coated or disposed on the rib part 30 described above, and then the hole 35 for forming the inside conductor in an inside of the cover part is formed by a laser in a step of FIG. 3 (d). A drilling method by a laser does not require exposing through a mask and development unlike UV exposure and therefore can be applied to a case in which arbitrary patterns are freely formed for short time. Publicly known lasers such as a YAG laser, a carbon dioxide laser, an excimer laser and the like can be used as the laser. A production method for the SAW filter in the present invention shall not be restricted to the method shown in FIG. 3. Either of UV exposure and laser radiation which is optionally selected according to a thickness of the rib part, a form of the inside conductor formed in an inside of the rib part and a form of a wiring pattern on a surface of the cover part can suitably be selected and used.

Figure 4:
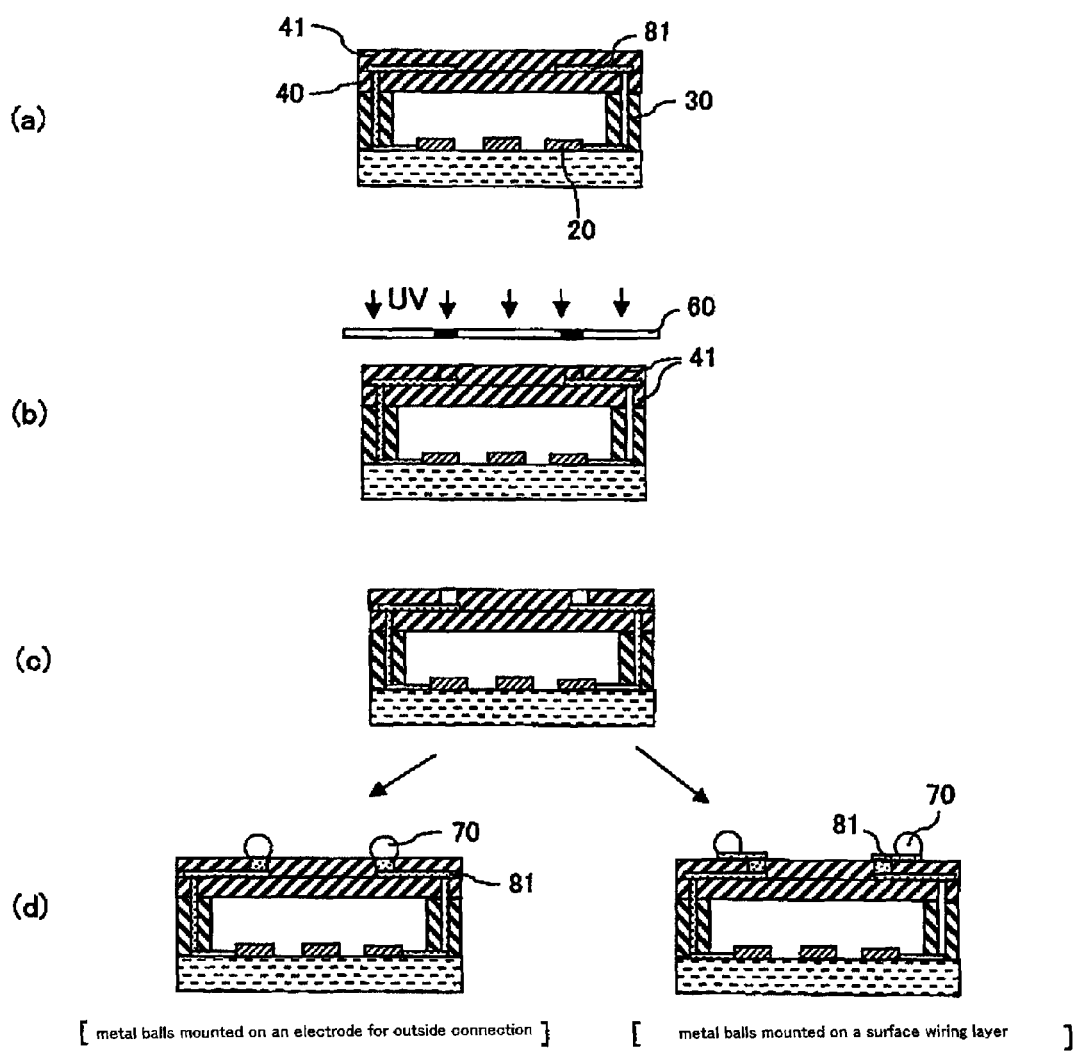
FIG. 4 is a drawing showing a wiring formation method for a SAW filter having a double layer wiring layer which is one of the electronic components of the present invention.

In FIG. 3, a production method for the SAW filter in which one surface wiring layer is formed on a surface of the cover part is shown, but in the present invention, two or more surface wiring layers can be provided as well on a part corresponding to the cover part described above. FIG. 4 shows a forming method for a wiring of a SAW filter having two wiring layers on a part corresponding to a cap part. After a wiring conductor 81 is formed on a surface of the cover part in the SAW filter by the same methods as shown in FIG. 3 (a) to (e), the photosensitive resin composition 41 for a cover part according to the present invention is coated thereon (FIG. 4 (a)), and then a mask 60 in which a part corresponding to a diameter of an electrode for outside connection is shielded from light is used to carry out UV ray exposure (FIG. 4 (b)); and a hole for the electrode for outside connection is formed on an uppermost layer of a cover part 40 by solvent development (FIG. 4 (c)). Next, the electrode for outside connection is formed by a plating method, and then metal balls are finally mounted on a surface of the cap part by reflow and the like to obtain the SAW filter of the present invention which is an electronic component having a hollow structure (FIG. 4 (d)). In the above case, the metal balls are directly mounted via an oxidation preventing metal film (Ni, Au and the like) for the electrode for outside connection (left drawing in FIG. 4 (d)), but a method in which a wiring layer is formed again on a surface of the cover part by using a photoresist and the like and in which the metal balls are then mounted thereon may be employed as well (right drawing in FIG. 4 (d)).

The hollow structure of the SAW filter is finished being preparinged passing through the above steps.

When the SAW filter prepared in the manner described above is sealed by a sealant, it is carried out usually by the following step, but it shall not be restricted to this step.

(1) The SAW filter is set in a molding metal die.

(2) A solid sealant tablet is set in a pot of a molding machine.

(3) The sealant is melt on a condition of a metal die temperature of 150 to 180° C., and pressure is applied to let it flow into the metal die (mold).

(4) Pressure is applied for 30 to 120 seconds to thermally cure the sealant, and then the metal die is opened to take out a molded article, whereby sealing of the SAW filter is finished.

Figure 5:
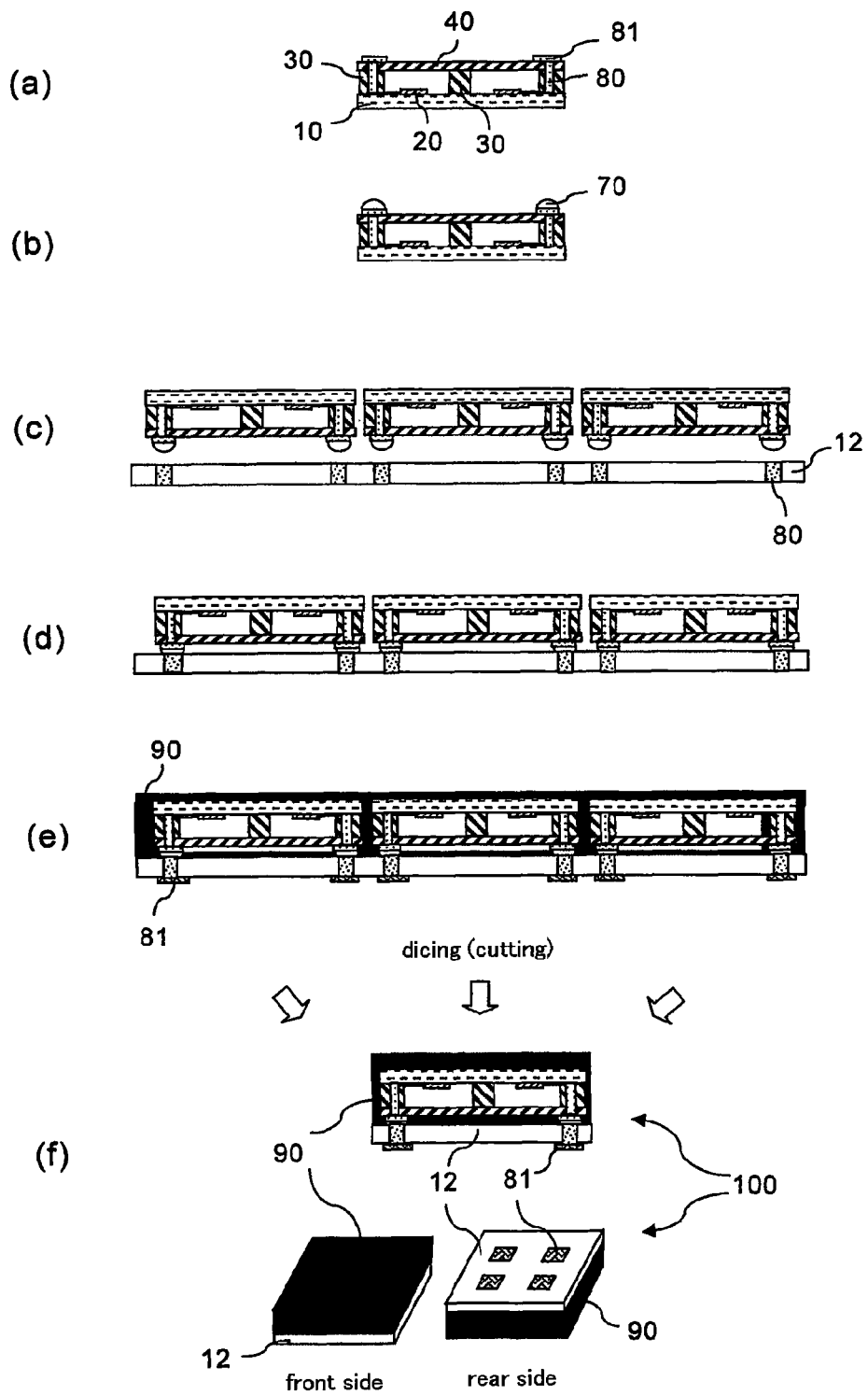
FIG. 5 is a drawing showing a production method for a SAW filter sealed with a sealant which is another embodiment of the present invention.

One example of a production method for a SAW filter sealed by a sealant which is another embodiment is shown in FIG. 5. In FIG. 5, first, a SAW filter element on which metal balls 70 are mounted is prepared by the same method as the method shown in FIG. 3 (FIGS. 5 (a) and (b)). In this regard, the SAW filter element has a structure in which a rib part 30 is formed not only in an outside frame of a hollow structure but also in an inside thereof. Next, the SAW filter element is mounted on a wiring substrate 12 such as a ceramic substrate, a printed substrate (including a flexible printed substrate) and the like and electrically connected with the wiring substrate 12 by reflow and the like (FIGS. 5 (c) and (d)). Then, a hollow structure part is sealed in a lump by a transfer molding method using a resin sealant 90 (FIG. 5 (e)), and it is divided into individual pieces by a method such as dicing (cutting) and the like to obtain SAW filters 100 (FIG. 5 (f)). The SAW filter 100 thus obtained has a structure in which a conductor 81 for wiring as an electrode for outside connection is provided on the wiring substrate 12 positioned on one face thereof and in which another face is sealed by the resin sealant 90. A method in which many pieces of the SAW filters formed on one substrate are sealed in a lump by sealant and then cut into individual pieces is shown in FIG. 5, but in the resin sealing type SAW filter, the SAW filter elements prepared in FIG. 5 (b) may be put one by one in metal dies for sealing and individually sealed by the resin.

Figure 6:
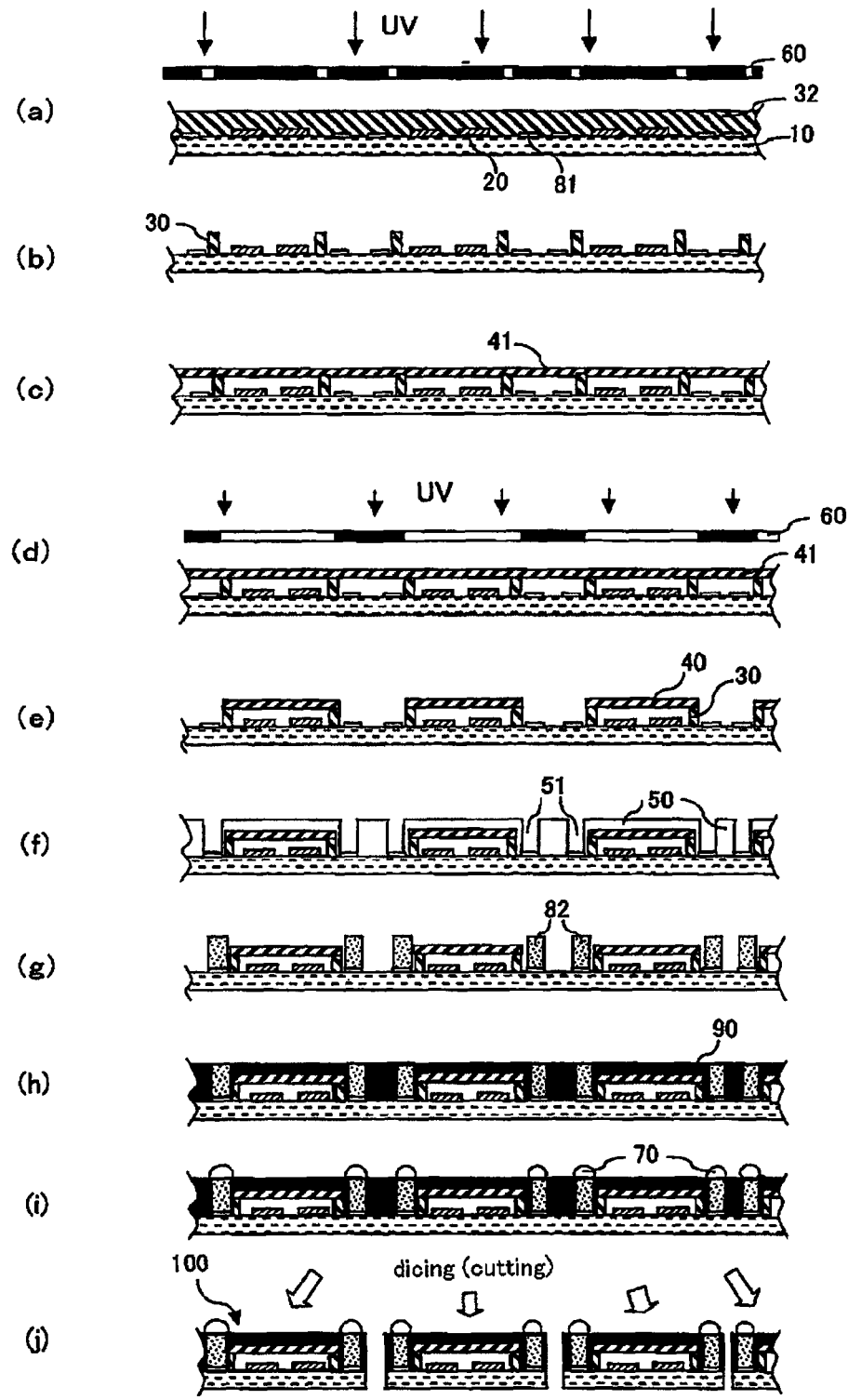
FIG. 6 is a drawing showing another production method for a SAW filter sealed with a sealant which is another embodiment of the present invention.

Another production method for a SAW filter sealed by a sealant is shown in FIG. 6. First, many pieces of SAW filters having an aluminum comb-shaped electrode 20 and a conductor 81 for wiring are prepared on one substrate, and then the photosensitive resin composition or the photosensitive film of the present invention is used to form a rib material and/or a cover material (FIG. 6 (a) to (e)). In the above method, the conductors 81 for wiring for electrically connecting with an electrode for outside connection are arranged at both outsides of the aluminum comb-shaped electrode 20. Next, a photoresist 50 is coated on a whole surface of the substrate in order to form the electrode for outside connection and exposed to a UV ray by using a mask in which a part corresponding to a diameter of the electrode for outside connection is shielded from light, and it is developed to provide a photoresist aperture part 51 for forming the electrode for outside connection (FIG. 6 (f)). Subsequently, the electrode 82 for outside connection is formed by a plating method or a conductor filling method, and then the photoresist 50 is removed by a photoresist remover (FIG. 6 (g)). Further, a cleaning step for completely removing photoresist residues present on the surfaces of the substrate and the cover part may be employed. Then, a hollow structure part is sealed in a lump by a transfer molding method using a resin sealant 90 (FIG. 6 (h)), and after mounting metal balls by reflow (FIG. 6 (i)), it is divided into individual pieces by a method such as dicing (cutting) and the like to obtain SAW filters 100 (FIG. 6 (j)). In the present invention, the metal balls may be mounted in a state of an individual piece package after the dicing step of the substrate.

In the above case, a molding resistance at a metal die temperature of 150 to 180° C. is required to a cover part 40 and/or a rib part 30. That is, when the cover part 40 and/or the rib part 30 are prepared by the photosensitive resin composition, the cover part 40 and/or the rib part 30 are not deformed preferably at a temperature of 150 to 180° C., and in order to obtain the above characteristic, the cover part 40 and/or the rib part 30 have preferably a glass transition temperature of 180° C. or higher. Also, an elastic modulus thereof at 150° C. is preferably 0.5 GPa or more, more preferably 1.0 GPa or more and particularly preferably 1.5 GPa or more. An upper limit of the elastic modulus at 150° C. shall not specifically be restricted, and it is 10 GPa or less from a practical viewpoint. Providing them with the elastic modulus described above makes it possible to enhance the molding resistance and prevent a ribbing agent from collapsing. Further, it can prevent the cover material from sagging and maintain a flatness thereof.

As shown above, according to the present invention, thick film rib patterns can be formed on a piezoelectric substrate in a lump by photolithography using a solvent developer in a SAW filter production step. Further, it is sealed thereon by a cured product of the photosensitive resin composition formed in a film form (or a sealing substrate of ceramics and the like), whereby a hollow structure can be formed. Also, an inside of the above hollow structure can be prevented from moisture by the peripheral resin composition, and therefore the aluminum electrode can be inhibited from being corroded. Further, the above resin composition has a high elastic modulus at high temperature, and therefore the hollow structure can be maintained as well at high temperature and high pressure during molding the sealing resin.

EXAMPLES

The present invention shall more specifically be explained below with reference to examples and comparative examples, but the present invention shall not be restricted to the following examples.

Examples 1 to 18 and Comparative Examples 1 to 3

A photopolymerizable compound (A) having at least one ethylenically unsaturated e group, a photopolymerization initiator (B) and an inorganic filler (C) were mixed respectively in blending proportions (parts by mass) shown in the following Table 1 and Table 2 to obtain solutions of photosensitive resin compositions of Examples 1 to 18 and Comparative Examples 1 to 3. Numerals in Table 1 and Table 2 show parts by mass of the solid matters. The respective components in Table 1 and Table 2 show the following ones. Amidomethacrylate (synthetic product), amidoacrylate (synthetic product), urethaneacrylate (synthetic product), UN-904 (trade name, urethaneacrylate, manufacture by Negami Chemical Industrial Co., Ltd.), UN-952 (trade name, urethaneacrylate, manufacture by Negami Chemical Industrial Co., Ltd.), EA-6340 (trade name, tetrahydrophthalic anhydride-modified vinyl group-containing phenol type epoxy resin, manufacture by Shin-Nakamura Chemical Co., Ltd.), A-DPH (trade name, dipentaerythritol hexaacrylate, manufacture by Shin-Nakamura Chemical Co., Ltd.), multifunctional bisphenol A novolac type epoxy resin (trade name: EPICLON N-865, manufacture by Dainippon Ink & Chemicals Inc.), photosensitive polyimide (solvent developing negative type photosensitive polyimide UR-3100E series, manufacture by Toray Industries Inc.), IRGACURE-OXE01 (trade name, 1,2-octanedione-1-[4-(phenylthio)phenyl]-2-(O-benzoyl oxime, manufacture by Ciba Specialty Chemicals K.K.), cationic polymerization initiator (diphenyl[4-(phenylthio)phenyl]sulfonium trifluorotrispentafluoroethyl phosphate), 4 products of mica A, mica B, silica A and silica B each shown below as inorganic fillers, mica A (aspect ratio: 90, volume average particle diameter: 27 μm), mica B (aspect ratio: 30, volume average particle diameter: 5 μm), silica A (spherical silica, volume average particle diameter: 0.5 μm) and silica B (Aerosil, volume average particle diameter: 16 nm).

Synthesis of Amidomethacrylate:

A reaction vessel of 1 liter equipped with a thermometer and a stirring device was charged with 380.0 g (2.0 mole) of 1,3-phenylenebisoxazoline and 228.0 g (1.0 mole) of bisphenol A, and the mixture was stirred at 150° C. for 10 hours. Then, 500 ppm of hydroquinone monomethyl ether and 172.0 g (2.0 mole) of methacrylic acid were added thereto and stirred at 100° C. for 6 hours, and 190 g of dimethylacetamide was dropwise added thereto and further stirred at 100° C. for 6 hours. When an acid value thereof reached 1.1 mg KOH/g, stirring was stopped to obtain a solution of a compound represented by the following Formula (5) which was a photopolymerizable unsaturated compound. The solution thus obtained had a solid content of 80% by mass.

[Ka 5]

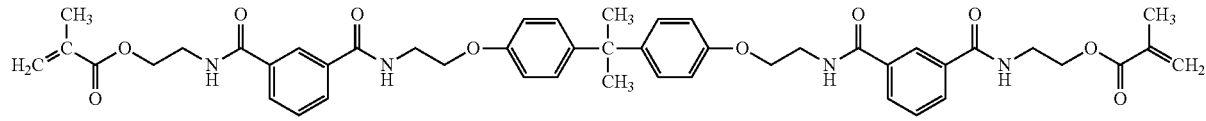

(5)

Synthesis of Amidoacrylate:

Amidoacrylate was synthesized by the same method as a case of the amidomethacrylate described above, except that 144.0 g (2 mole) of acrylic acid was used in place of methacrylic acid. The solution obtained had a solid content of 80% by mass.

Synthesis of Urethaneacrylate:

A reaction vessel of 1 liter equipped with a thermometer and a stirring device was charged with 72.0 g of 1,4-cyclohexanedimethanol, 193.0 g of m-xylylenediisocyanate and 380 g of cyclohexanone, and the mixture was heated at 90 to 100° C. while stirring under nitrogen gas flow to react them for 1 hour. Then, 306.0 g of pentaerythritol triacrylate was added thereto, and reaction was carried out until absorption of isocyanate observed by infrared spectroscopic analysis disappeared to obtain a solution of a urethaneacrylate compound represented by the following Formula (6). The solution obtained had a solid content of 60% by mass.

[Ka 6]

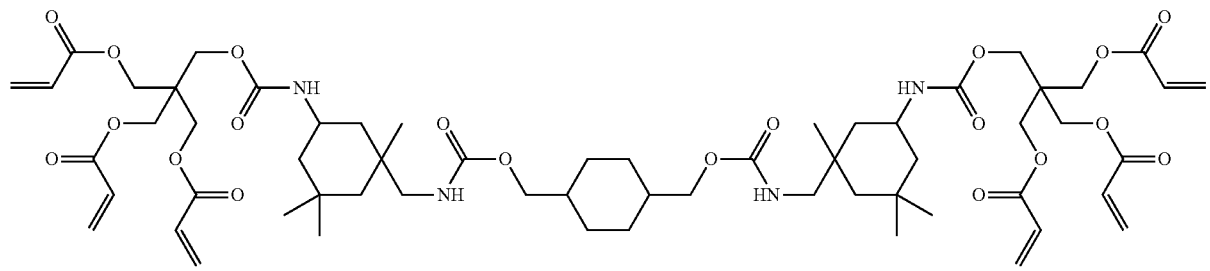

(6)

<Evaluation of Resolution>

Figure 7:
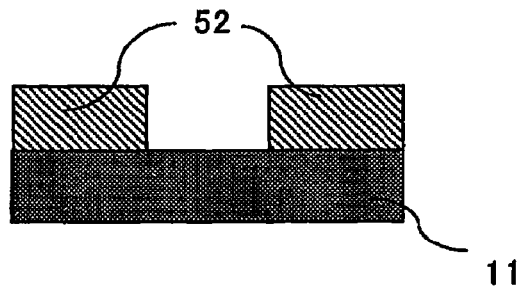
FIG. 7 is a drawing showing a criterion for evaluating a resolution of the photosensitive resin composition of the present invention.
Figure 7:
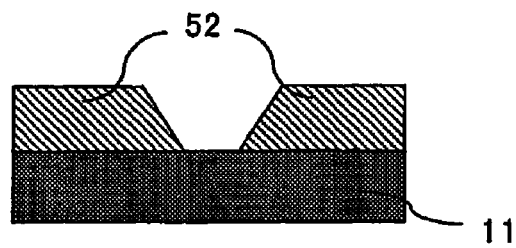
Figure 7:
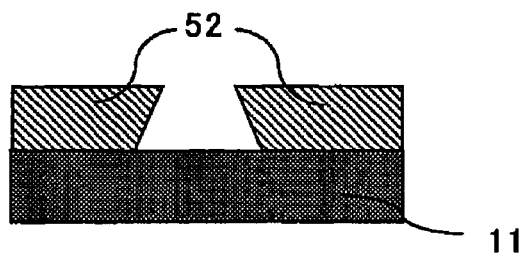

The solutions of the photosensitive resin compositions prepared in the examples and the comparative examples were evenly coated on a silicon substrate by means of a spin coater and dried on a hot plate of 90° C. for 5 minutes to form a photosensitive resin layer having a film thickness of 30 μm after dried. The above test substrate on which the photosensitive resin layer was formed was used to expose the photosensitive resin composition layer at an exposure value of 200 mJ/cm² via a negative mask having an aperture pattern of a hole diameter 60 μmφ by means of a proximity exposing equipment (trade name: UX-1000SM) manufactured by Ushio Inc. The above test substrate was dipped in propylene glycol monomethyl ether acetate which was an organic solvent base developer for 3 minutes and developed. The resist pattern after developed was rinsed by n-butyl acetate and observed after dried to evaluate a solvent resistance thereof based on the following criteria as shown in FIG. 7. In FIG. 7, 11 shows the silicon substrate, and 50 shows the photosensitive resin composition. The results thereof are shown in Table 1 and Table 2.

A: as shown in FIG. 7 (*a*), a hole having a diameter of 60 μmφ is opened, and an aperture part thereof is rectangular and has no residues after development.

B: as shown in FIG. 7 (*b*), a hole having a diameter of 60 μmφ is opened, and an aperture part thereof is tapered.

C: as shown in FIG. 7 (*c*), a hole having a diameter of 60 μmφ is opened, and an aperture part thereof is reversely tapered.

<Hollow Holding Property>

The solutions of the photosensitive resin compositions prepared in the examples and the comparative examples were evenly coated on a silicon substrate by means of a spin coater and dried on a hot plate of 90° C. for 5 minutes to form a photosensitive resin layer having a film thickness of 30 μm after dried. The above test substrate on which the photosensitive resin composition layer was formed was used to expose the photosensitive resin layer at an exposure value of 200 mJ/cm² via a negative mask having an aperture pattern of a lattice size 1 mM☐ by means of the proximity exposing equipment (trade name: UX-1000SM) manufactured by Ushio Inc. The above test substrate was developed and cured to obtain a cured film pattern opened in a lattice form.

A photosensitive film having a photosensitive resin layer having a film thickness of 30 μm which was prepared by coating the photosensitive resin composition on a polyethylene terephthalate film having a thickness of 50 μm as a supporting film was stuck thereon to form a hollow structure.

Then, the photosensitive resin film was exposed at an exposure value of 200 mJ/cm² by means of the proximity exposing equipment (trade name: UX-1000SM) manufactured by Ushio Inc. After the above test substrate was cured at 120° C. for 30 minutes, at 160° C. for 30 minutes and at 220° C. for 60 minutes, the supporting film described above was peeled off, and a cross section of the lattice pattern which was cut after cured was observed under a microscope to evaluate a hollow holding property thereof based on the following criteria. The results thereof are shown in Table 1 and Table 2.

A: the hollow part can be held, and the cured film does not sag at all.

B: the hollow part can be held, but the film is observed to sag even if only slightly.

C: the film sags, and the hollow part is crushed.

<Measurement of Elastic Modulus at High Temperature (Alternative Evaluation for Molding Pressure Resistance) and Measurement of Glass Transition Temperature>

The solutions of the photosensitive resin compositions prepared in the examples and the comparative examples were evenly coated on a silicon substrate by means of a spin coater and dried on a hot plate of 90° C. for 5 minutes to form a photosensitive resin composition layer having a film thickness of 30 μm after dried. The above test substrate on which the photosensitive resin composition layer was formed was used to expose the photosensitive resin composition layer at an exposure value of 200 mJ/cm² by means of the proximity exposing equipment (trade name: UX-1000SM) manufactured by Ushio Inc. and photocure it. The above photosensitive resin composition layer was cured by heating at 120° C. for 30 minutes, at 160° C. for 30 minutes and at 220° C. for 60 minutes. The resulting cured film of the photosensitive resin composition was peeled off from the silicon substrate, and an elastic modulus of the peeled cured film at 150° C. and a glass transition temperature thereof were measured by means of a viscoelasticity test equipment (trade name: RSA-III, manufactured by TA Instruments Inc.). The measurement was carried out on the conditions of a test mode: tensile, a test temperature: room temperature to 300° C., a heating rate: 3° C./minute, a test frequency: 1 Hz and a chuck-to-chuck distance: 20 mm. The results thereof are shown in Table 1 and Table 2.

<Evaluation of Moisture and Heat Resistance>

The solutions of the photosensitive resin compositions prepared in the examples and the comparative examples were evenly coated on a silicon substrate by means of a spin coater and dried on a hot plate of 90° C. for 5 minutes to form a photosensitive resin composition layer having a film thickness of 30 μm after dried. The above test substrate on which the photosensitive resin composition layer was formed was used to expose the photosensitive resin composition layer at an exposure value of 200 mJ/cm² by means of the proximity exposing equipment (trade name: UX-1000SM) manufactured by Ushio Inc. and photocure it. Then, the above photosensitive resin composition layer was cured by heating at 120° C. for 30 minutes, at 160° C. for 30 minutes and at 220° C. for 60 minutes. After the above test substrate was left standing for 100 hours on the conditions of 121° C., 100% RH and 2 atmosphere, an appearance of the cured film was visually evaluated, and an adhesive property thereof was further evaluated by a cross-cut adhesion test according to JIS K5400 (1990). The evaluation criteria are shown below. The results thereof are shown in Table 1 and Table 2.

Appearance:

A: turbidity, peeling, swelling and cracks are not observed on the cured film.

B: any one of turbidity, peeling, swelling and cracks is observed a little on the cured film.

C: any one of turbidity, peeling, swelling and cracks is observed on the cured film.

Cross-Cut Adhesion Test:

The number of the remaining cross-cuts after peeling the tape is:

A: 100/100 (no peeling)

B: ≥90/100 (1 to 10 cross-cuts are peeled)

C: <90/100 (more than 10 cross-cuts are peeled)

TABLE 1

| | | | Example | | | | | | | | |
|---|---|---|---|---|---|---|---|---|---|---|---|
| | | | 1 | 2 | 3 | 4 | 5 | 6 | 7 | 8 | 9 |
| Component (A) | Amidoacrylate | | 100 | | 50 | | 50 | 50 | 80 | 60 | 30 |
| | Amidomethacrylate | | | 100 | | 50 | | | | | |
| | UN-904 | | | | 50 | 50 | | | | | 30 |
| | UN-952 | | | | | | | | | | |
| | Urethaneacrylate | | | | | | | | | | |
| | EA-6340 | | | | | | 50 | | | | |
| | A-DPH | | | | | | | 50 | | | |
| | N-865 | | | | | | | | 20 | | |
| | Photosensitive polyimide | | | | | | | | | | |
| Component (B) | IRGACURE-OXE01 | | 3 | 3 | 3 | 3 | 3 | 3 | 3 | 2 | 2 |
| | Cationic polymerization initiator | | | | | | | | 1 | | |
| Inorganic filler | Mica A | | | | | | | | | 40 | |
| | Mica B | | | | | | | | | | 40 |
| | Silica A | | | | | | | | | | |
| | Silica B | | | | | | | | | | |
| Resolution | | | A | A | A | A | B | B | A | B | B |
| Hollow holding property | | | A | A | A | A | A | A | A | A | A |
| High temperature elastic modulus (GPa) | | | 0.5 | 0.5 | 0.5 | 0.5 | 0.5 | 0.6 | 0.6 | 7.2 | 8.3 |
| Glass transition temperature (° C.) | | | 174 | 175 | 180 | 180 | 175 | 180 | 180 | 180 | 190 |
| Moisture and heat resistance | 121° C. 100% RH 100 hours | Appearance | A | A | A | A | A | A | A | A | A |
| | | Cross-cut adhesion test | A | A | A | A | A | A | B | A | A |

(the blending amounts of the respective components show solid matter amounts)

TABLE 2

|  |  | Example | | | | | | | | | Comparative Example | | |
|---|---|---|---|---|---|---|---|---|---|---|---|---|---|
|  |  | 10 | 11 | 12 | 13 | 14 | 15 | 16 | 17 | 18 | 1 | 2 | 3 |
| Component (A) | Amidoacrylate |  | 90 |  |  |  |  |  |  |  |  |  |  |
|  | Amidomethacrylate | 30 |  |  |  |  |  | 30 | 50 | 80 |  |  |  |
|  | UN-904 | 30 |  | 100 |  | 60 |  | 30 |  |  |  |  |  |
|  | UN-952 |  |  |  |  |  |  |  | 50 |  |  |  |  |
|  | Urethaneacrylate |  |  |  |  |  |  |  |  | 20 |  |  |  |
|  | EA-6340 |  |  |  | 100 |  | 90 |  |  |  |  |  |  |
|  | A-DPH |  |  |  |  |  |  |  |  |  |  |  |  |
|  | N-865 |  |  |  |  |  |  |  |  |  | 100 | 100 |  |
|  | Photosensitive polyimide |  |  |  |  |  |  |  |  |  |  |  | 100 |
| Component (B) | IRGACURE-OXE01 | 3 | 3 | 3 | 3 | 3 | 3 | 3 | 3 | 3 |  |  |  |
|  | Cationic polymerization initiator |  |  |  |  |  |  |  |  |  | 3 | 5 |  |
| Inorganic filler | Mica A | 40 |  |  |  | 40 |  |  |  |  |  |  |  |
|  | Mica B |  |  |  |  |  |  |  |  |  |  |  |  |
|  | Silica A |  | 10 |  |  |  |  | 20 |  |  |  |  |  |
|  | Silica B |  |  |  |  |  | 10 | 20 |  |  |  |  |  |
| Resolution |  | B | A | B | B | B | B | B | A | A | A | A | C* |
| Hollow holding property |  | A | A | A | A | A | A | A | A | A | B | B | A |
| High temperature elastic modulus (GPa) |  | 8.3 | 1.0 | 1.6 | 0.5 | 8.4 | 1.0 | 3.5 | 0.6 | 0.5 | 0.6 | 0.8 | 3.5 |
| Glass transition temperature (° C.) |  | 190 | 174 | 190 | 172 | 198 | 170 | 180 | 176 | 175 | 170 | 176 | 250 |
| Moisture and heat resistance | 121° C. 100% RH 100 hours | Appearance | A | A | A | B | A | B | A | A | A | C | C | A |
|  |  | Cross-cut adhesion test | A | A | B | B | B | B | A | A | A | C | C | A |

(the blending amounts of the respective components show solid matter amounts)
*the exposure amount was set to 600 mJ/cm² in order to form a film having a thickness of 30 μm.

As shown in the examples in Table 1 and Table 2, it can be found that the photosensitive resin compositions containing the photopolymerizable compound (A) having at least one ethylenically unsaturated group and the photopolymerization initiator (B) are evaluated to A or B or higher in the respective characteristics and provide excellent effects.

In the photosensitive resin compositions of the present invention, an adhesive property thereof with the substrate is enhanced by using an acrylate compound or a methacrylate compound having an amide group as the photopolymerizable compound (A) having at least one ethylenically unsaturated group, and therefore they are excellent in a moisture and heat resistance under high temperature and high humidity (Examples 1 to 6). In particular, it has been found that a single system containing the acrylate compound or the methacrylate compound having an amide group is excellent in a balance between the moisture and heat resistance, the hollow holding property and the resolution and that it is a resin composition which is very effective to film formation and an improvement in the film physical properties (Examples 1 to 2). The reason therefor is considered to be attributable to that the acrylate compound or the methacrylate compound having an amide group has not only a high heat resistance and a high adhesive property but also a good photosensitive characteristic. Also, when the acrylate compound or the methacrylate compound having an amide group is used in combination with the acrylate compound or the methacrylate compound containing a urethane bond, they can exert characteristics for both of the resolution and the cured film physical properties in a certain case (Examples 3, 4 and 17 to 18).
Page37(11th Line from the Top~)
On the other hand, when the component A is constituted only from the acrylate compound or the methacrylate compound containing a urethane bond, the excellent characteristics have been shown in the hollow holding property and the appearance under high temperature and high humidity as is the case with an instance of the acrylate compound or the methacrylate compound having an amide group (Example 12).

The photosensitive resin compositions of the present invention can enhance not only the hollow holding property but also the high temperature elastic modulus to a large extent by containing mica having a high aspect ratio and a relatively large particle diameter as the inorganic filler (C) in addition to the compound (A) containing an acrylate compound or a methacrylate compound having an amide group and the photopolymerization initiator (B) (Examples 8 to 10). Also, even when spherical silica having a small particle diameter and silica such as Aerosil and the like are used as the inorganic filler (C), the hollow holding property can be enhanced according to the blending amounts thereof (Examples 11, 15 and 16). The photosensitive resin compositions of the present invention are already excellent in a hollow holding property, a high temperature elastic modulus and a moisture and heat resistance even if they do not contain the inorganic filler, and the inorganic filler having a small particle diameter can be used in order to enhance further the above characteristics. Further, silica B (Aerosil) described in Example 15 has the effect that it can enhance not only the characteristics shown in Table 2 but also a coating property and a form maintaining property in coating the photosensitive resin composition.

In contrast with this, when the photosensitive epoxy resin is used as the component (A), the moisture and heat resistance, particularly the adhesive property is reduced to a large extent (Comparative Examples 1 and 2). The photosensitive resin composition described in Comparative Example 1 contains less polymerization initiator and is insufficiently cured, and therefore it has a low high temperature elastic modulus and is inferior as well in a hollow holding property. Also, the resin composition containing the photosensitive polyimide resin described in Comparative Example 3 has to be increased in an exposure amount for forming a thick film. However, it is difficult to allow light in exposing to reach a lower part (a part close to the substrate) of the film even at a high exposure amount, and the lower part is developed too much in the developing step to form a film which is reversely tapered, so that a pattern forming property thereof has been observed to be reduced to a large extent.

Page38(3Rd Line from the Top~)

As shown above, in the present invention, the photosensitive resin composition containing the photopolymerizable compound having at least one ethylenically unsaturated group, particularly, the acrylate compound or the methacrylate compound having an amide group or the acrylate compound or the methacrylate compound containing a urethane bond and the photopolymerization initiator and the photosensitive film prepared by using the above photosensitive resin composition are excellent in a moisture and heat resistance and provide a cured product thereof with a high elastic modulus at high temperature, and they are excellent as well in a hollow structure holding property, so that they can be used as a rib material and/or a cover material for a hollow structure device.

According to the present invention, an electronic component of a high reliability, to be specific, a SAW filter can be prepared at a low cost by applying the photosensitive resin composition which is excellent in a workability and a reliability and the photosensitive film prepared by using the same to a forming method for a rib pattern and a forming method for a hollow structure.

INDUSTRIAL APPLICABILITY

The photosensitive resin compositions of the present invention and the photosensitive film prepared by using the same can be applied as materials requiring a photosensitivity when preparing not only electronic components of a hollow structure such as SAW filters and the like but also products of other fields to which a moisture and heat resistance and a high elastic modulus at high temperature are required, for example, devices and equipments for forming images, recording images or displaying images or energy-related devices and equipments such as batteries, dynamos and the like.

What is claimed is:

1. A photosensitive resin composition containing (A) a photopolymerizable compound having at least one ethylenically unsaturated group and (B) a photopolymerization initiator, wherein the photopolymerizable compound (A) having at least one ethylenically unsaturated group includes a compound represented by the following Formula (1):

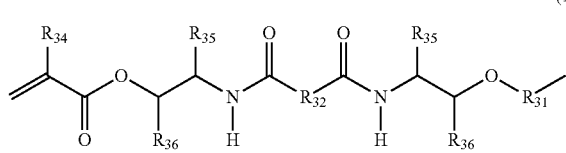

(1)

-continued

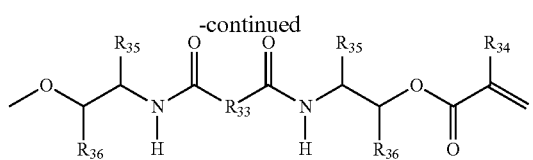

wherein $R_{31}$, $R_{32}$ and $R_{33}$ each represent independently a divalent organic group; $R_{34}$ represents a hydrogen atom or a methyl group; and $R_{35}$ and $R_{36}$ each represent independently a hydrogen atom, an alkyl group having 1 to 4 carbon atoms or a phenyl group, and wherein a content of the photopolymerizable compound (A) having at least one ethylenically unsaturated group is 90 to 99.5% by mass based on a whole amount of solid matters of the photosensitive resin composition, with the proviso that when the photosensitive resin composition contains an inorganic filler, the whole amount of solid matters does not include the inorganic filler.

2. The photosensitive resin composition according to claim 1, wherein the photopolymerizable compound (A) further comprises an acrylate compound or a methacrylate compound containing a urethane bond.

3. A hollow structure formed on a substrate of an electronic component by a rib material and a cover material, wherein the rib material and/or the cover material comprise the photosensitive resin composition according to claim 2.

4. A hollow structure formed on a substrate of an electronic component by a rib material and a cover material, wherein the rib material and/or the cover material comprise a photosensitive film prepared by molding the photosensitive resin composition according to claim 2 in a film form.

5. The photosensitive resin composition according to claim 1, further containing (C) an inorganic filler.

6. The photosensitive resin composition according to claim 5, wherein a tensile elastic modulus after cured is 0.5 GPa or more at 150° C.

7. A photosensitive film prepared by molding the photosensitive resin composition according to claim 5 in a film form.

8. The photosensitive resin composition according to claim 5, wherein the inorganic filler (C) comprises a filler having an average aspect ratio of 30 to 100 and a volume average particle diameter of 5 to 50 μm.

9. A hollow structure formed on a substrate of an electronic component by a rib material and a cover material, wherein the rib material and/or the cover material comprise the photosensitive resin composition according to claim 1.

10. A method for forming a rib pattern for forming a hollow structure, comprising a photosensitive resin layer laminating step for laminating the photosensitive resin composition according to claim 1 on a substrate, to form a photosensitive resin layer, an exposing step for irradiating a prescribed part of the photosensitive resin layer with an active energy light ray via a mask to photocure the exposed part, a removing step for removing parts other than the exposed part of the photosensitive resin layer with a developer and a thermal curing step for thermally curing the exposed part of the photosensitive resin layer to form a resin cured product.

11. A method for forming a hollow structure comprising a photosensitive resin layer laminating step for laminating the photosensitive resin composition according to claim 1 on a rib pattern provided for forming a hollow structure on a substrate so that a cover part of the hollow structure is formed thereon, to form a photosensitive resin layer, an exposing step for irradiating a prescribed part of the photosensitive resin layer with an active energy light ray via a mask to photocure the exposed part, a removing step for removing parts other than the exposed part of the photosensitive resin layer with a developer and a thermal curing step for thermally curing the exposed part of the photosensitive resin layer to form a resin cured product.

12. The method for forming a hollow structure according to claim 11, wherein the rib pattern provided for forming a hollow structure on a substrate is formed by a method comprising a photosensitive resin layer laminating step for laminating said photosensitive resin composition on a substrate, to form a photosensitive resin layer, an exposing step for irradiating a prescribed part of the photosensitive resin layer with an active energy light ray via a mask to photocure the exposed part, a removing step for removing parts other than the exposed part of the photosensitive resin layer with a developer and a thermal curing step for thermally curing the exposed part of the photosensitive resin layer to form a resin cured product.

13. An electronic component having a hollow structure prepared by forming a rib part or a cover part of the hollow structure by using the photosensitive resin composition according to claim 1.

14. The electronic component according to claim 13, wherein said electronic component is a surface acoustic wave filter.

15. The photosensitive resin composition according to claim 1, wherein a tensile elastic modulus after cured is 0.5 GPa or more at 150° C.

16. A photosensitive film prepared by molding the photosensitive resin composition according to claim 1 in a film form.

17. A method for forming a rib pattern for forming a hollow structure, comprising a photosensitive resin layer laminating step for laminating the photosensitive film according to claim 16 on a substrate, to form a photosensitive resin layer, an exposing step for irradiating a prescribed part of the photosensitive resin layer with an active energy light ray via a mask to photocure the exposed part, a removing step for removing parts other than the exposed part of the photosensitive resin layer with a developer and a thermal curing step for thermally curing the exposed part of the photosensitive resin layer to form a resin cured product.

18. A method for forming a hollow structure comprising a photosensitive resin layer laminating step for laminating the photosensitive film according to claim 16 on a rib pattern provided for forming a hollow structure on a substrate so that a cover part of the hollow structure is formed thereon, to form a photosensitive resin layer, an exposing step for irradiating a prescribed part of the photosensitive resin layer with an active energy light ray via a mask to photocure the exposed part, a removing step for removing parts other than the exposed part of the photosensitive resin layer with a developer and a thermal curing step for thermally curing the exposed part of the photosensitive resin layer to form a resin cured product.

19. An electronic component having a hollow structure prepared by forming a rib part or a cover part of the hollow structure by using the photosensitive film according to claim 16.

20. A hollow structure formed on a substrate of an electronic component by a rib material and a cover material, wherein the rib material and/or the cover material comprise a photosensitive film prepared by molding the photosensitive resin composition according to claim 1 in a film form.

21. The photosensitive resin composition according to claim 1, wherein the compound represented by the Formula (1) is a di(meth)acrylate having an amide bond, obtained by reacting an oxazoline-containing compound with at least one of a carboxyl group-containing compound and a phenolic hydroxyl group-containing compound.

* * * * *